(12) United States Patent
Yang et al.

(10) Patent No.: US 11,657,869 B2
(45) Date of Patent: *May 23, 2023

(54) SRAM DESIGN WITH FOUR-POLY-PITCH

(71) Applicant: Taiwan Semiconductor Manufacturing Company Limited, Hsinchu (TW)

(72) Inventors: Chih-Chuan Yang, Tainan (TW); Feng-Ming Chang, Zhubei (TW); Kuo-Hsiu Hsu, Zhongli (TW); Ping-Wei Wang, Hsinchu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/528,929

(22) Filed: Nov. 17, 2021

(65) Prior Publication Data
US 2022/0076740 A1    Mar. 10, 2022

Related U.S. Application Data

(63) Continuation of application No. 16/926,249, filed on Jul. 10, 2020, now Pat. No. 11,205,474.

(51) Int. Cl.
*G11C 11/412* (2006.01)
*H01L 27/11* (2006.01)

(52) U.S. Cl.
CPC ........ *G11C 11/412* (2013.01); *H01L 27/1104* (2013.01)

(58) Field of Classification Search
CPC . G11C 11/412; G11C 2029/0403; G11C 8/16; H01L 27/1104; H01L 27/0207; H01L 21/8239
(Continued)

(56) References Cited

U.S. PATENT DOCUMENTS 10,050,045 B1 *   8/2018  Hsu ..................... H01L 27/1104
11,205,474 B1 * 12/2021  Yang .................... H01L 27/0207
(Continued)

OTHER PUBLICATIONS

Notice of Allowance on U.S. Appl. No. 16/926,249 dated Aug. 18, 2021.
(Continued)

*Primary Examiner* — Fernando Hidalgo
(74) *Attorney, Agent, or Firm* — Foley & Lardner LLP

(57) ABSTRACT

One aspect of this description relates to a memory cell. In some embodiments, the memory cell includes a first gate structure, a second gate structure, a third gate structure, a fourth gate structure, and a fifth gate structure that each extend along a first lateral direction, a first active structure extending along a second lateral direction and overlaid by respective first portions of the first to fourth gate structures, a second active structure extending along the second lateral direction and overlaid by respective second portions of the first to fourth gate structures, and a third active structure extending along the second lateral direction and overlaid by respective third portions of the third and fifth gate structures. In some embodiments, the first and second gate structures are aligned with each other, with the fourth and fifth gate structures aligned with a first segment and a second segment of the third gate structure, respectively. In some embodiments, the second lateral direction perpendicular to the first lateral direction.

20 Claims, 13 Drawing Sheets

(58) Field of Classification Search
USPC .......................................................... 365/154
See application file for complete search history.

(56) References Cited

U.S. PATENT DOCUMENTS

| | | |
|---|---|---|
| 2017/0221904 A1 | 8/2017 | Liaw |
| 2019/0272868 A1 | 9/2019 | Guo et al. |
| 2020/0083231 A1 | 3/2020 | Rahim et al. |

OTHER PUBLICATIONS

U.S. Non-Final Office Action U.S. Appl. No. 16/926,249 dated Apr. 21, 2021.
U.S. Office Action on U.S. Appl. No. 16/926,249 dated Apr. 22, 2021.

\* cited by examiner

SRAM DESIGN WITH FOUR-POLY-PITCH

CROSS-REFERENCE TO RELATED APPLICATION

This application is related to and claims priority under 35 U.S. § 120 as a continuation of U.S. Utility application Ser. No. 16/926,249, filed Jul. 10, 2020, titled "SRAM DESIGN WITH FOUR-POLY-PITCH," the entire contents of which are incorporated herein by reference for all purposes.

BACKGROUND

The semiconductor integrated circuit (IC) industry has produced a wide variety of digital devices to address issues in a number of different areas. Some of these digital devices are configured for the storage of data. Static random access memory (SRAM) device is a type of volatile semiconductor memory that stores data bits using circuitry that does not need refreshing. An SRAM device typically includes one or more memory arrays, wherein each array includes a plurality of SRAM cells. An SRAM cell is typically referred to as a bit cell because it stores one bit of information, represented by the logic state of two cross coupled inverters.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
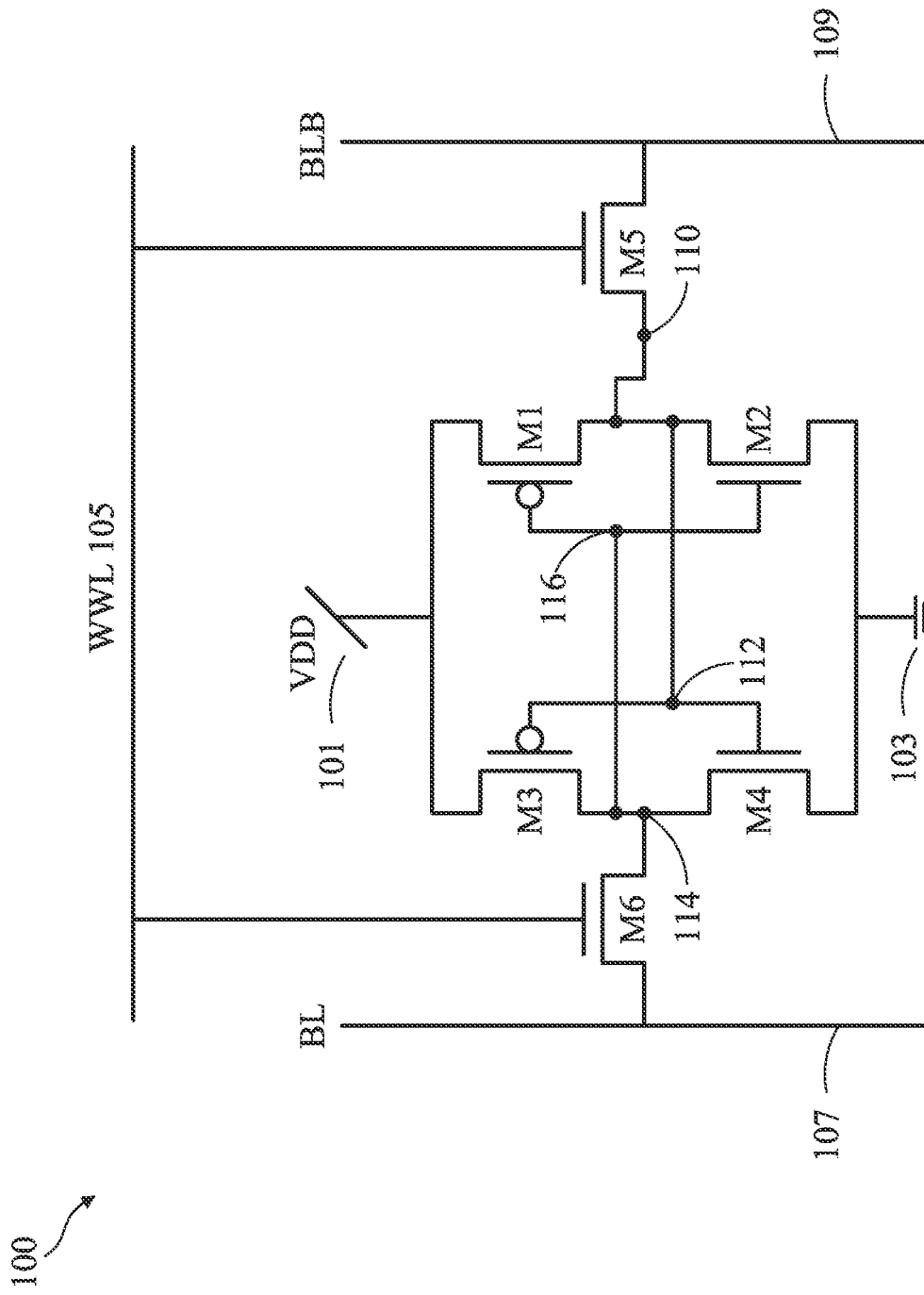
FIG. 1 is an example circuit diagram of a memory cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A memory cell array includes M×N memory cells (e.g., 1 bit cells). The memory cell array further includes N bit lines and N bit bar lines. Each bit line and bit bar line is coupled to M memory cells. The memory cell array further includes M word lines. Each word line is coupled to N memory cells. A conventional design of a memory cell is a 2 contact poly pitch (2CPP) memory cell. That is, the conventional memory cell has two rows of gate structure. However, the conventional has high WL loading, due to the large cell width and a lack of routing resources. This is particularly true for eight transistor (8T) and ten transistor (10T) memory cells. Also, the 2CPP design uses interconnect process (ICP) to connect the internal nodes of the memory cell, which adds costs to the fabrication process.

The present disclosure provides various embodiments of one or more memory cells in a (e.g., nanostructure) transistor configuration. Each memory cell includes one or more access transistors and one or more pull-down transistors. To resolve the above-identified technical issues without compromising the design constraints, a memory cell in accordance with the present disclosure includes a 4CPP design. That is, the memory cell has four rows of gate structure. Having four rows of gate structure enables the memory cell to have a smaller width. Thus, the word line routing resistance to the farthest cell (e.g., the farthest bit) is lower, resulting in less word line loading. The four row design enables more space for routing in the direction of the word line. Thus, the loading can be reduced further by routing the word line in two metal layers in parallel. Moreover, the internal nodes of the 4CPP design can be coupled using VD, VG, and M0 layers instead of using the ICP, saving fabrication cost.

Referring to FIG. 1, an example circuit diagram of a memory cell (a memory bit, or a bit cell) 100 is illustrated. In accordance with some embodiments of the present disclosure, the memory cell 100 in configured as a static random access memory (SRAM) cell that includes a number of transistors. For example in FIG. 1, the memory cell 100 includes a six-transistor (6T)-SRAM cell. Each of the transistors may be formed in a nanostructure transistor configuration, which shall be discussed in further detail below. In some other embodiments, the memory cell 100 may be implemented as any of a variety of SRAM cells such as, for example, a two-transistor-two-resistor (2T-2R) SRAM cell, a four-transistor (4T)-SRAM cell, an eight-transistor (8T)-SRAM cell, a ten-transistor (10T)-SRAM cell, etc. Although the discussion of the current disclosure is directed to an SRAM cell, it is understood that other embodiments of the current disclosure can also be used in any of the memory cells such as, for example, dynamic random access (DRAM) memory cells.

As shown in FIG. 1, the memory cell 100 includes 6 transistors: M1, M2, M3, M4, M5, and M6. The transistors M1 and M2 are formed as a first inverter and the transistors M3 and M4 are formed as a second inverter, wherein the first and second inverters are cross-coupled to each other. Specifically, the first and second inverters are each coupled between first voltage reference 101 and second voltage reference 103. In some embodiments, the first voltage reference 101 is a voltage level of a supply voltage applied to the memory cell 100, which is typically referred to as "Vdd." The second voltage reference 103 is typically referred to as "ground." The first inverter (formed by the transistors M1 and M2) is coupled to the transistor M5, and the second inverter (formed by the transistors M3 and M4) is coupled to the transistor M6. In addition to being coupled to the first and second inverters, the transistors M6 and M5 are each coupled to a word line (WL) 105 and are coupled to a bit line (BL) 107 and a bit bar line 109 (BBL), respectively.

In some embodiments, the transistors M1 and M3 are referred to as pull-up transistors of the memory cell 100 (hereinafter "pull-up transistor M1" and "pull-up transistor M3," respectively); the transistors M2 and M4 are referred to as pull-down transistors of the memory cell 100 (hereinafter "pull-down transistor M2" and "pull-down transistor M4," respectively); and the transistors M5 and M6 are referred to as access transistors of the memory cell 100 (hereinafter "access transistor M5" and "access transistor M6," respectively). In some embodiments, the transistors M2, M4, M5, and M6 each includes an n-type metal-oxide-semiconductor (NMOS) transistor, and M1 and M3 each includes a p-type metal-oxide-semiconductor (PMOS) transistor. Although the illustrated embodiment of FIG. 1 shows that the transistors M1-M6 are either NMOS or PMOS transistors, any of a variety of transistors or devices that are suitable for use in a memory device may be implemented as at least one of the transistors M1-M6 such as, for example, a bipolar junction transistor (BJT), a high-electron-mobility transistor (HEMT), etc.

The access transistors M5 and M6 each has a gate coupled to the WL 105. The gates of the transistors M5 and M6 are configured to receive a pulse signal, through the WL 105, to allow or block an access of the memory cell 100 accordingly, which will be discussed in further detail below. The transistors M2 and M5 are coupled to each other at node 110 with the transistor M2's drain and the transistor M5's source. The node 110 is further coupled to a drain of the transistor M1 and node 112. The transistors M4 and M6 are coupled to each other at node 114 with the transistor M4's drain and the transistor M6's source. The node 114 is further coupled to a drain of the transistor M3 and node 116.

When a memory cell (e.g., the memory cell 100) stores a data bit, a first node of the bit cell is configured to be at a first logical state (either a logical 1 or a logical 0), and a second node of the bit cell is configured to be at a second logical state (either a logical 0 or a logical 1). The first and second logical states are complementary with each other. In some embodiments, the first logical state at the first node may represent the logical state of the data bit stored in the memory cell. For example, in the illustrated embodiment of FIG. 1, when the memory cell 100 store a data bit at a logical 1 state, the node 110 is configured to be at the logical 1 state, and the node 114 is configured to be at the logical 0 state.

To read the logical state of the data bit stored in the memory cell 100, the BL 107 and BBL 109 are pre-charged to Vdd (e.g., a logical high, e.g., using a capacitor to hold the charge). Then the WL 105 is asserted, or activated, by an assert signal to a logical high, which turns on the access transistors M5 and M6. Specifically, a rising edge of the assert signal is received at the gates of the access transistors M5 and M6, respectively, so as to turn on the access transistors M5 and M6. Once the access transistors M5 and M6 are turned on, based on the logical state of the data bit, the pre-charged BL 107 or BBL 109 may start to be discharged. For example, when the memory cell 100 stores a logical 0, the node 114 (e.g., Q) may present a voltage corresponding to the logical 1, and the node 110 (e.g., Q bar) may present a voltage corresponding to the complementary logical 0. In response to the access transistors M5 and M6 being turned on, a discharge path, starting from the pre-charged BBL 109, through the access transistor M5 and pull-down transistor M2, and to ground 103, may be provided. While the voltage level on the BBL 109 is pulled down by such a discharge path, the pull-down transistor M4 may remain turned off. As such, the BL 107 and the BBL 109 may respectively present a voltage level to produce a large enough voltage difference between the BL 107 and BBL 109. Accordingly, a sensing amplifier, coupled to the BL 107 and BBL 109, can use a polarity of the voltage difference to determine whether the logical state of the data bit is a logical 1 or a logical 0.

To write the logical state of the data bit stored in the memory cell 100, the data to be written is applied to the BL 107 and/or the BBL 109. For example, BBL 109 is tied/shorted to 0V, e.g., ground 103, with a low-impedance connection. Then, the WL 105 is asserted, or activated, by an assert signal to a logical high, which turns on the access transistors M5 and M6. Once the access transistors M5 and M6 are turned on, based on the logical state of BBL 109, the node 110 may start to be discharged. For example, before M5 and M6 are turned on, the BBL 109 may present a voltage corresponding to the logical 0, and the node 110 may present a voltage corresponding to the complementary logical 1. In response to the access transistors M5 and M6 being turned on, a discharge path, starting from the node 110, through the access transistor M5 to ground 103, may be provided. Once the voltage level on the node 110 is pulled down below the Vth (threshold voltage) of the pull-down transistor M4, M4 may turn off and M3 may turn on, causing node 114 to be pulled up to Vdd 101. Once node 114 is less than a Vth from Vdd 101, M1 may turn off and M2 may turn on, causing node 110 to be pulled down to ground 103. Then, when the WL 105 is de-asserted, the logical state applied to the BL 107 and/or the BBL 109 has been stored in the memory cell 100.

The conventional 2CPP memory cell results in high WL loading and use of the expensive interconnect layer for connecting the internal nodes. In this regard, each of the transistors (e.g., M1-M6 of FIG. 1, M1-M8 of FIG. 5, and M1-M10 of FIG. 9) is configured in accordance with various embodiments of the present disclosure. Further, the memory cells include four rows of gate structures. The rows, and the gate structures therein, extend in the direction of the cell width and the rows are separated in the direction of a cell height. The four rows allow a reduction in the WL loading via a smaller cell width and a stacking of metal routes.

Moreover, the four-row design eliminates the need for ICP. As such, the above-identified technical issues can be resolved.

Figure 2:
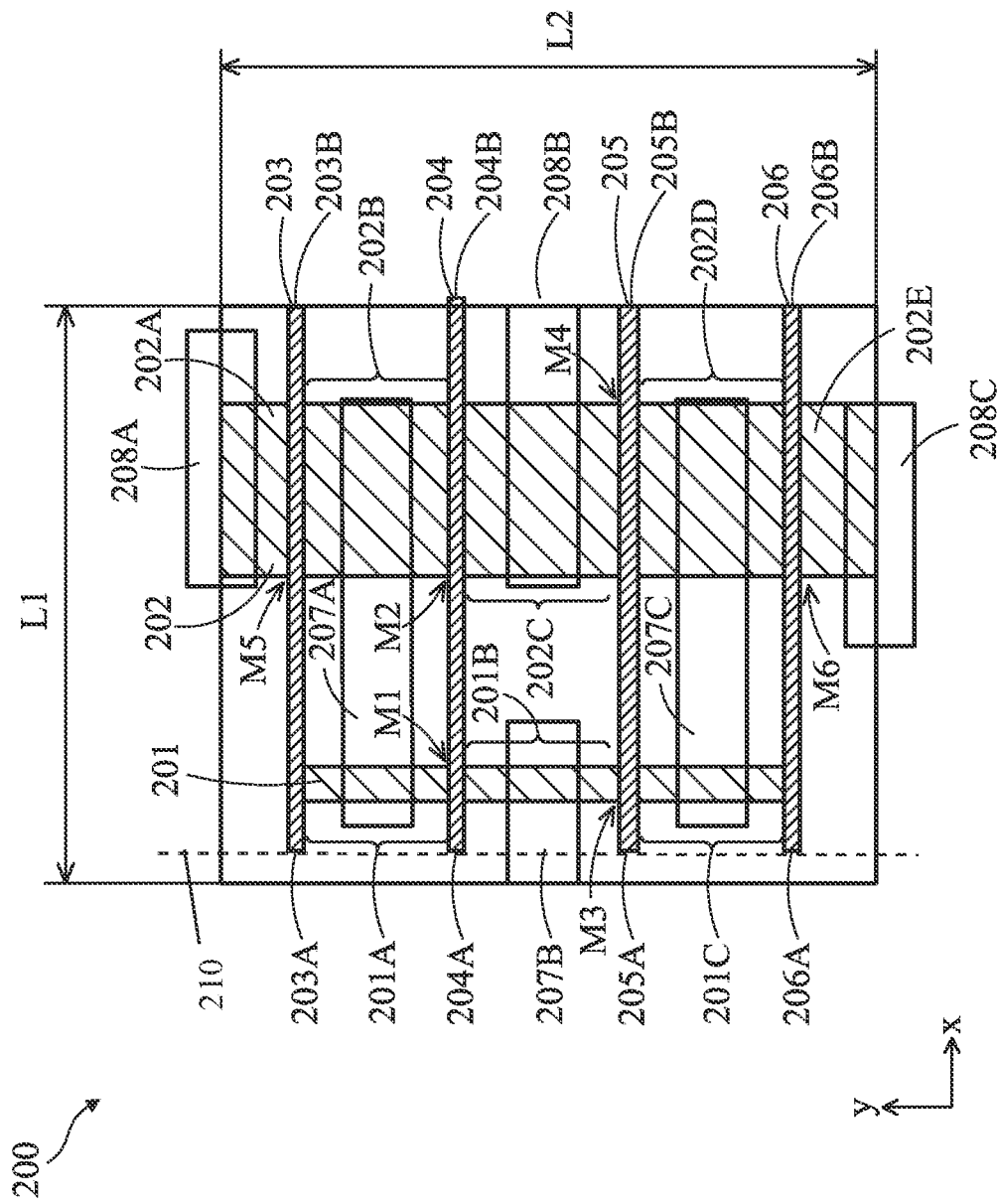
FIG. 2 is an example circuit layout, in accordance with some embodiments.
Figure 3:
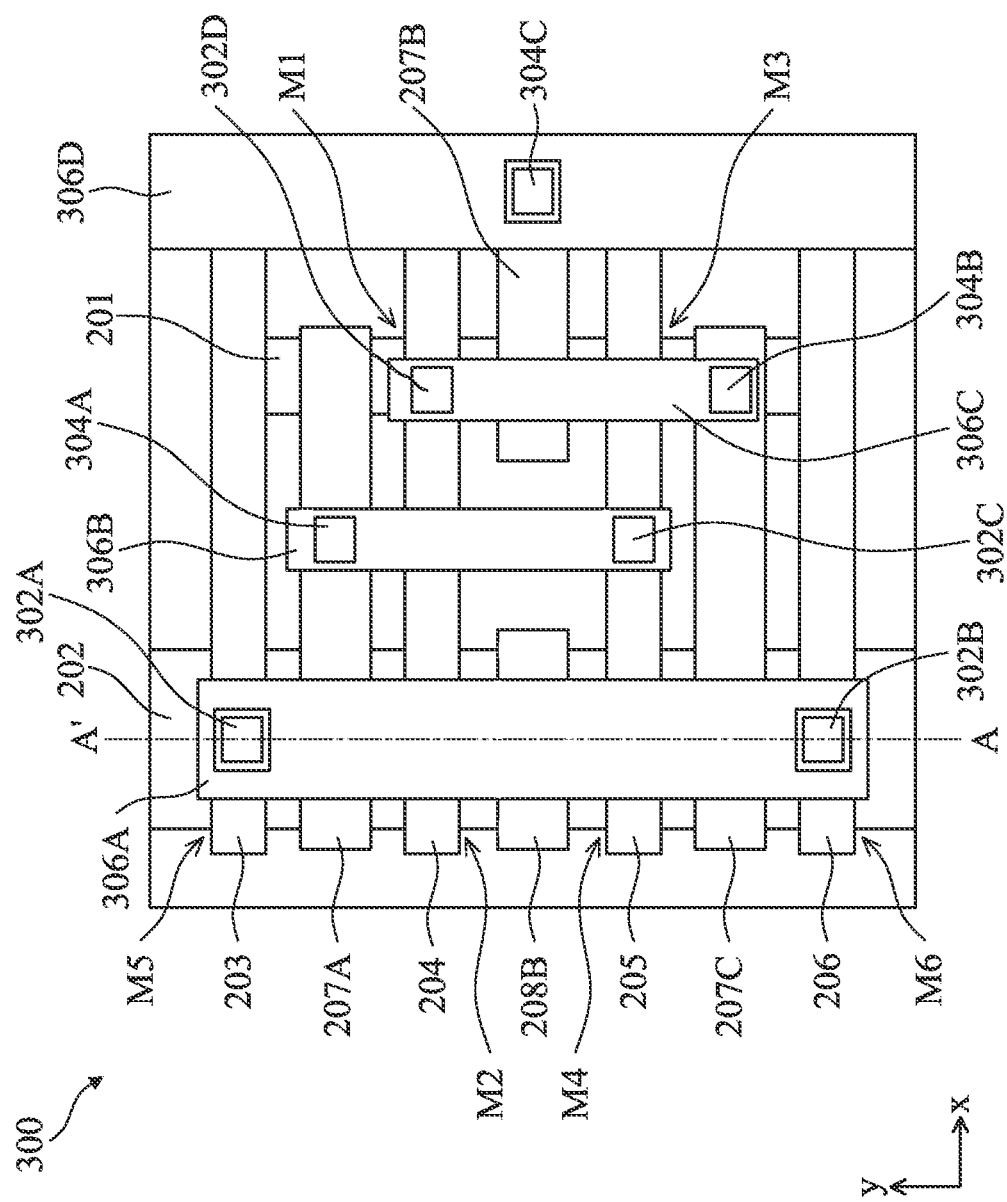
FIG. 3 is an example circuit layout, in accordance with some embodiments.

FIGS. 2 and 3 illustrate various examples of circuit layouts to make the memory cell 100 in such a configuration. The layouts shown in FIGS. 2-3 may be used to fabricate nanostructure transistors, in some embodiments. However, it is understood that the layouts of FIGS. 2-3 are not limited to fabricating nanostructure transistors. Each of the layouts of FIGS. 2-3 may be used to fabricate any of various other types of transistors such as, for example, fin-based transistors (typically knows as FinFETs), nanowire transistors, while remaining within the scope of the present disclosure. The components of the layouts shown in FIGS. 2-3 are the same or are similar to those depicted in FIG. 1 with the same reference number, and the detailed description thereof is omitted. It is appreciated that for clarity purposes, each of the layouts in FIGS. 2-3 has been simplified. Thus, some of the components (e.g., BL 107, BBL109, WL 105) shown in FIG. 1 are omitted in the layouts of FIGS. 2-3.

Referring to FIG. 2, an example circuit layout 200 is depicted, in accordance with various embodiments. As shown, the circuit layout 200 includes a number of features 201 and 202 extending along a first direction (e.g., the Y direction), and a number of features 203, 204, 205, and 206 extending along a second direction (e.g., the X direction) perpendicular to the first direction. In some embodiments, the first direction and the second direction are interchanged (e.g., the X direction is referred to as the first direction and the Y direction is referred to as the second direction).

Each of the features 201-206 may correspond to one or more patterning process (e.g., a photolithography process) to make a physical device feature. For example, the features 201-202 may be used to define or otherwise make an active region on a substrate. Such an active region may be a stack of alternating layers of one or more nanostructure transistors, a fin-shaped region of one or more FinFETs, or a doped well region of one or more planar transistors. The active region may serve as a source region or drain region of the respective transistor. Accordingly, the features 201-202 may be herein referred to as "active features 201 and 202," respectively. In some embodiments, the active feature 202 may correspond to an n-type region, and the active features 201 may correspond to a p-type region.

The features 203-206 may be used to define or otherwise make gates (e.g., gate regions, gate structures, conductive structures, etc.) of, or shared by, one or more of the transistors. Accordingly, the features 203-206 may be herein referred to as "gate features 203, 204, 205, and 206," respectively.

The gate features 203, 204, 205, and 206 are arranged in four rows. For example, the gate feature 203 is in the first row, the gate feature 204 is in the second row, the gate feature 205 is in the third row, and the gate feature 206 is in the fourth row. The gate feature 204 is separated from the gate feature 203 in the first direction. The gate feature 205 is separated from the gate feature 203 and gate feature 204 in the first direction and is closer to the gate feature 204 than to the gate feature 203. The gate feature 206 is separated from the gate feature 203, the gate feature 204, and the gate feature 205 in the first direction, and is closer to the gate feature 205 than to the gate feature 203 or the gate feature 204.

The gate feature 203 includes a first end 203A and a second end 203B. The gate feature 204 includes a first end 204A and a second end 204B. The gate feature 205 includes a first end 205A and a second end 205B. The gate feature 206 includes a first end 206A and a second end 206B. In some embodiments, the first end 203A is aligned, in the second direction, with the first end 204A, the first end 205A, and the first end 206A. In some embodiments, the second end 203B is aligned, in the second direction, with the second end 204B, the second end 205B, and the second end 206B. An imaginary line 210 is shown in FIG. 2 to further illustrate that the first ends 203A, 204A, 205A, and 206A align. The imaginary line 210 is shown to extend in the first direction and intersect each of the first ends 203A, 204A, 205A, and 206A. The imaginary line 210 is only for illustrating alignment and does not correspond to an actual feature or structure of the circuit layout 200. In some embodiments, the gate features 203 and 204 are aligned in FIG. 2. This means that the first ends 203A and 204A are aligned with each other, and the second ends 203B and 204B are aligned with each other.

The length of each of the gate features 203-206 in the second direction (that is, from the respective first end to the respective second end) is L1. The length of the active feature 202 in the first direction is L2. In some embodiments, L2 is greater than L1.

Each of the gate features 203-206 can extend across at least one of the active features 201-202 to define a respective at least one of the transistors M1-M6. For example, the gate feature 203 is used to define a gate region of the access transistor M5, sections 202A and 202B of the active feature 202 are used to define respective source region and drain region of the access transistor M5, and a portion of the active feature 202 overlapped by the gate feature 203 is used to define nanostructures (e.g., a conduction channel) of the access transistor M5. The gate feature 204 is used to define a gate region of the pull-down transistor M2, sections 202B and 202C of the active feature 202 are used to define respective drain region and source region of the pull-down transistor M2, and a portion of the active feature 202 overlapped by the gate feature 204 is used to define nanostructures (e.g., a conduction channel) of the pull-down transistor M2. The gate feature 204 is also used to define a gate region of the pull-up transistor M1, sections 201A and 201B of the active feature 201 are used to define respective drain region and source region of the pull-up transistor M1, and a portion of the active feature 201 overlapped by the gate feature 204 is used to define nanostructures (e.g., a conduction channel) of the pull-up transistor M1. The gate feature 205 is used to define a gate region of the pull-up transistor M3, sections 201B and 201C of the active feature 201 are used to define respective source region and drain region of the pull-up transistor M3, and a portion of the active feature 201 overlapped by the gate feature 205 is used to define nanostructures (e.g., a conduction channel) of the pull-up transistor M3. The gate feature 205 is also used to define a gate region of the pull-down transistor M4, sections 202C and 202D of the active feature 202 are used to define respective source region and drain region of the pull-down transistor M4, and a portion of the active feature 202 overlapped by the gate feature 205 is used to define nanostructures (e.g., a conduction channel) of the pull-down transistor M4. The gate feature 206 is used to define a gate region of the access transistor M6, sections 202D and 202E of the active feature 202 are used to define respective drain region and source region of the access transistor M6, and a portion of the active feature 202 overlapped by the gate feature 206 is used to define nanostructures (e.g., a conduction channel) of the access transistor M6.

In some embodiments, each of the transistors M1-M6, formed by the layout 200 (and the layouts 300, 600-800, and 1000, which shall be discussed below), is referred to have a fin number of one, based on the number of active feature(s) overlaid by the respective gate feature of each of the transistors. It is appreciated that each of the transistors M1-M6, and any other transistors, can have any fin number while remaining within the scope of the present disclosure.

Additionally, the layout 200 includes a number of features 207A, 207B, 207C, 208A, 208B, and 208C extending along the second direction. Each of the 207A, 207B, 207C, 208A, 208B, and 208C may overlay the corresponding section of an active feature. In some embodiments, each of the features 207A-C and 208A-C may be used to define or otherwise make the metal-defined (MD) contact/structure for a respective one of the transistors M1-M6. Accordingly, the features 207A-C and 208A-C may be herein referred to as "contact features 207A-C and 208A-C," respectively, or "MD features 207A-C and 208A-C," respectively. In some embodiments, such a MD structure can be formed as a via extending into the source/drain region of a respective one of the transistors M1-M6. The metal structures may be formed subsequently to the formation of source/drain regions of the transistors M1-M6. Accordingly, the metal structures may sometimes be referred to as part of a middle-end-of-line (MEOL) layer or a back-end-of-line (BEOL) layer.

For example, the contact features 208A and 207A may be used to form metal structures extending into the source region and drain region of the access transistor M5, respectively. The contact features 207A and 208B may be used to form metal structures extending into the drain region and source region of the pull-down transistor M2, respectively. The contact features 207A and 207B may be used to form metal structures extending into the drain region and source region of the pull-up transistor M1, respectively. The contact features 207B and 207C may be used to form metal structures extending into the source region and drain region of the pull-up transistor M3, respectively. The contact features 208B and 207C may be used to form metal structures extending into the source region and drain region of the pull-down transistor M4, respectively. The contact features 207C and 208C may be used to form metal structures extending into the drain region and source region of the access transistor M6, respectively.

It is appreciated that the contact feature 207A may be used to form a continuous metal structure shared by (e.g., connected to each of) the access transistor M5's drain and the pull-down transistor M2's drain, the contact feature 207B may be used to form a continuous metal structure shared (e.g., connected) by the pull-up transistor M1's source and the pull-up transistor M3's source, the contact feature 208B may be used to form a continuous metal structure shared (e.g., connected) by the pull-down transistor M2's source and the pull-down transistor M4's source, and the contact feature 207C may be used to form a continuous metal structure shared (e.g., connected) by the pull-down transistor M4's drain and the access transistor M6's drain.

Referring to FIG. 3, an example circuit layout 300 is depicted, in accordance with various embodiments. The circuit layout 300 is similar to the circuit layout 200 of FIG. 2 except that the circuit layout 300 includes via over gate (VG), via over diffusion (VD), and metal 0 (M0) features.

Each of the features 302A-302D may be used to define or otherwise make a metal structure (e.g., one or more vias) extending into the gate region of one or more of the transistors M1-M6. Accordingly, the features 302A-302D may be herein referred to as "VG features 302A, 302B, 302C, and 302D," respectively. The VG feature 302A may be used to form a metal structure extending into the gate region of the access transistor M5. The VG feature 302B may be used to form a metal structure extending into the gate region of the access transistor M6. The VG feature 302C may be used to form a metal structure extending into the gate region shared by the pull-up transistor M3 and the pull-down transistor M4. The VG feature 302D may be used to form a metal structure extending into the gate region shared by the pull-up transistor M1 and the pull-down transistor M2.

Each of the features 304A-304C may be used to define or otherwise make a metal structure (e.g., one or more vias) extending into the metal-defined region of one or more of the transistors M1-M6. Accordingly, the features 304A-304C may be herein referred to as "VD features 304A, 304B, and 304C," respectively. The VD feature 304A may be used to form a metal structure extending into the MD region shared by the transistors M1, M2, and M5. The VD feature 304B may be used to form a metal structure extending into the MD region shared by the transistors M3, M4, and M6. The VD feature 304C may be used to form a metal structure extending into the MD region shared by the transistors M1 and M2.

Each of the features 306A-306D may be used to define or otherwise make a metal structure (e.g., a metal track, segment, etc.) extending in the first direction and extending (e.g., overlapping) over or more VD or VG regions. Accordingly, the features 302A-302D may be herein referred to as "M0 features 306A, 306B, 306C, and 306D," respectively. The M0 feature 306A may be used to form a metal structure extending from the VG feature 302A to the VG feature 302B. The M0 feature 306B may be used to form a metal structure extending from the VD feature 304A to the VG feature 302C. The M0 feature 306C may be used to form a metal structure extending from the VG feature 302D to the VD feature 304B. The M0 feature 306D may be used to form a metal structure extending over the VD feature 304C.

Figure 4:
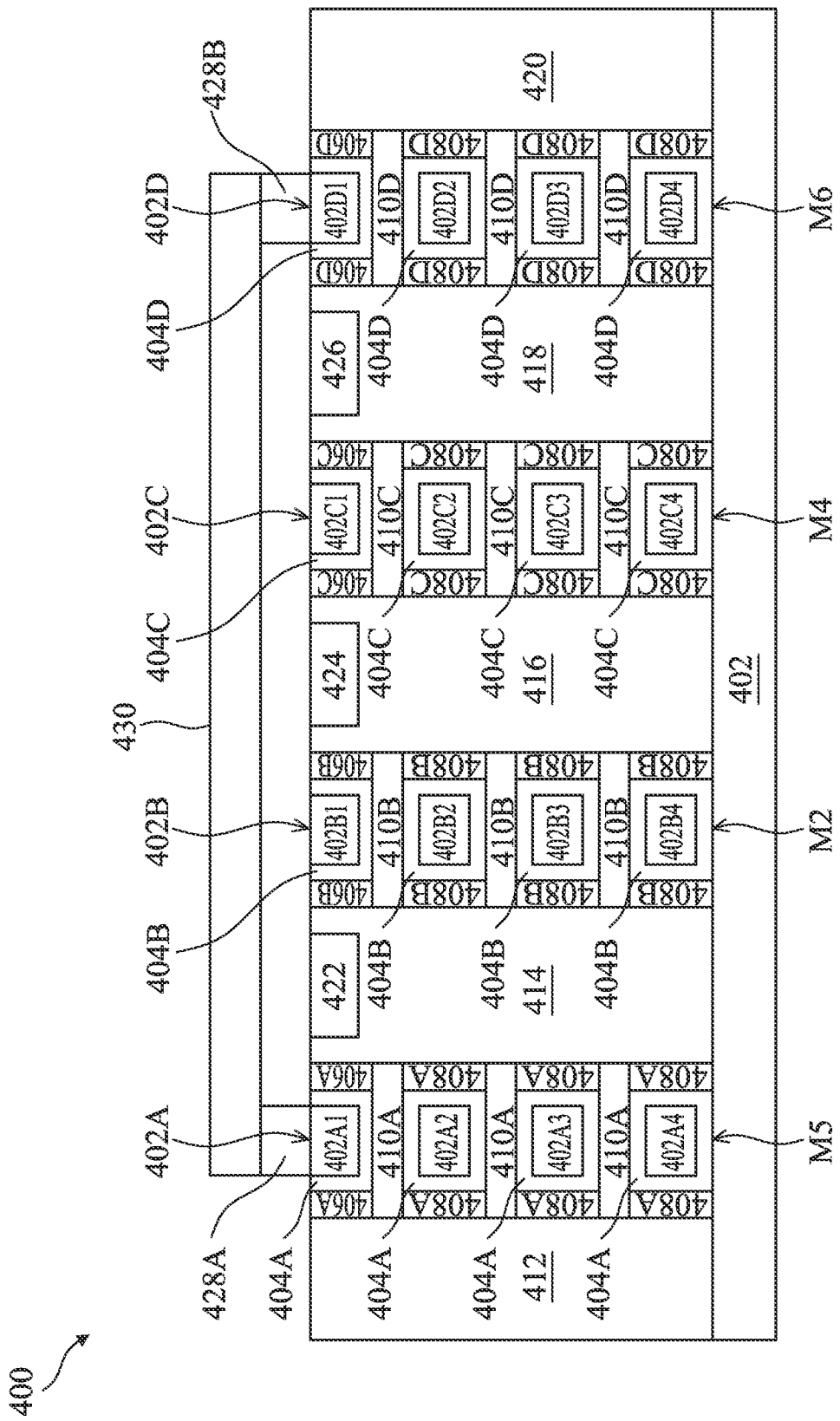
FIG. 4 is a cross-sectional view of a portion of the memory cell, in accordance with some embodiments.

FIG. 4 illustrates a cross-sectional view of a portion of the memory cell 100 cut along line A-A' of FIG. 3 (hereinafter "partial cell 400"), in accordance with various embodiments. The partial cell 400, as shown in the illustrated embodiment of FIG. 4, may be formed based on the layout 300 of FIG. 3. For example, the partial cell 400 corresponds to a portion of the layout 300, cut along line A-A', (e.g., 202, 203, 204, 205, 206, 207A, and 207C), which shall be discussed in further detail bellow. Although not located along the line A-A', additional metal structures are shown in the partial cell 400 of FIG. 4. Although not shown, it is appreciated that other portions of the memory cell 100 share a structure substantially similar to the cross-sectional view of FIG. 4.

As shown, the access transistor M5, pull-down transistor M2, pull-down transistor M4, and access transistor M6 are formed on a substrate 402. The access transistor M5 includes a gate metal 402A, a gate dielectric 404A, a pair of offset gate spacers 406A, a number of inner spacers 408A, a number of nanostructures 410A, a source region 412, and a drain region 414. The pull-down transistor M2 includes a gate metal 402B, a gate dielectric 404B, a pair of offset gate spacers 406B, a number of inner spacers 408B, a number of nanostructures 410B, a source region 416, and the drain region 414. The pull-down transistor M4 includes a gate metal 402C, a gate dielectric 404C, a pair of offset gate spacers 406C, a number of inner spacers 408C, a number of nanostructures 410C, the source region 416, and a drain region 418. The access transistor M6 includes a gate metal 402D, a gate dielectric 404D, a pair of offset gate spacers 406D, a number of inner spacers 408D, a number of nanostructures 410D, a source region 420, and the drain region 418.

In some embodiments, the gate metal 402A (together with the gate dielectric 404A and offset gate spacers 406A) may be formed in accordance with the gate feature 203 (FIGS. 2-3), the source region 412 may be formed in accordance with the section 202A (FIGS. 2-3), and the drain region 414 may be formed in accordance with the section 202B (FIGS. 2-3). Similarly, the gate metal 402B (together with the gate dielectric 404B and offset gate spacers 406B) may be formed in accordance with the gate feature 204 (FIGS. 2-3) and the source region 416 may be formed in accordance with the section 202C (FIGS. 2-3). Similarly, the gate metal 402C (together with the gate dielectric 404C and offset gate spacers 406C) may be formed in accordance with the gate feature 205 (FIGS. 2-3) and the drain region 418 may be formed in accordance with the section 202D (FIGS. 2-3). Similarly, the gate metal 402D (together with the gate dielectric 404D and offset gate spacers 406D) may be formed in accordance with the gate feature 206 (FIGS. 2-3) and the source region 420 may be formed in accordance with the section 202E (FIGS. 2-3). In some embodiments, each of the drain region 414 the source region 416, and the drain region 418 are continuous structures and shared by the adjacent transistors (e.g., 414 is shared by M5 and M2, 416 is shared by M2 and M4, and 418 is shared by M4 and M6). In some embodiments, the partial cell 400 includes a first layer including the drain/source regions 412, 414, 416, 418, and 420, and a second layer includes the gate metals 402A-402D.

The gate metal 402A of the access transistor M5 may include a number of gate metal sections 402A1, 402A2, 402A3, and 402A4. When viewed in perspective, the gate metal sections 402A1 and 402A2 may adjoin or merge together to wrap around one of the nanostructures 410A, with a portion of the gate dielectric 404A disposed therebetween. The gate metal sections 402A2 and 402A3 may adjoin or merge together to wrap around one of the nanostructures 410A, with a portion of the gate dielectric 404A disposed therebetween. The gate metal sections 402A3 and 402A4 may adjoin or merge together to wrap around one of the nanostructures 410A, with a portion of the gate dielectric 404A disposed therebetween. Gate metals 402B of M2, 402C of M4, and 402D of M6 have similar structures.

In some embodiments, the contact features 207A, 208B, and 207C (FIGS. 2-3) may be used to form MD structures 422, 424, and 426, respectively. The MD structures 422-426 are electrically connected to the drain/source regions 414-418, respectively. In some embodiments, the partial cell 400 includes a third layer including the MD structures 422-426.

In some embodiments, the VG features 302A and 302B (FIG. 3) may be used to form metal structures 428A and 428B, respectively. The metal structure 428A is electrically coupled to the gate structure 402A. Similarly, the metal structure 428B is electrically coupled to the gate structure 402D. Although not shown, VD features may be used to form metal structures. The metal structures formed according to VD features are electrically coupled to metal structures such as the metal structures 422, 424, and 426. In some embodiments, the partial cell 400 includes a fourth layer including the metal structures 428A-B.

In some embodiments, the M0 feature 306A (FIG. 3) may be used to form metal structure 430. In some embodiments, the partial cell 400 includes a fifth layer including the metal structure 430.

Figure 5:
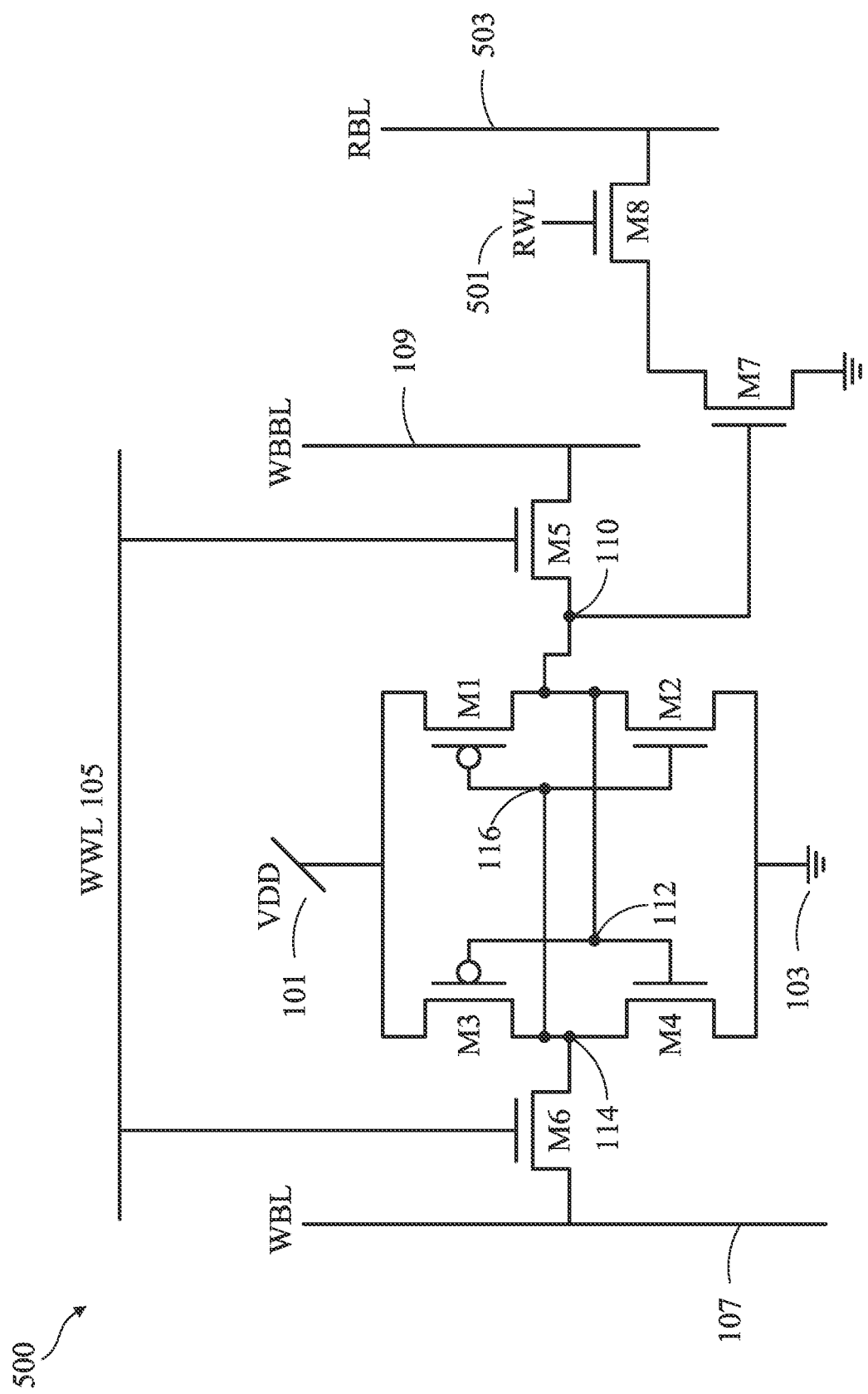
FIG. 5 is an example circuit diagram, in accordance with some embodiments.

Referring to FIG. 5, an example circuit diagram of a memory cell 500 is illustrated. The memory cell 500 is similar to the memory cell 100 of FIG. 1 except that the memory cell 500 includes two additional transistors (pull-down transistor M7 and access transistor M8), such that the memory cell 500 is that of an eight-transistor (8T)-SRAM cell.

A gate of the pull-down transistor M7 is coupled to the output of the inverter formed by the transistors M1 and M2. One of the source or drain of the access transistor M8 is coupled to a drain of the pull-down transistor M7. A source of the pull-down transistor M7 is coupled to ground. In some embodiments, M7 can be implemented as a pull-up transistor. A gate of the access transistor M8 is coupled to a read word line (RWL) 501. A second one of the source or drain of the access transistor M8 is coupled to the read bit line (RBL) 503. The WL 105, the BL 107, the BBL 109 are referred to herein as write word line (WWL) 105, write bit line (WBL) 107, and write bit bar line (WBBL) 109, respectively.

To read the logical state of the data bit stored in the memory cell 500, the RBL 503 is pre-charged to Vdd. Then the RWL 501 is asserted, or activated, by an assert signal to a logical high, which turns on the access transistor M8. Once the access transistor M8 is turned on, based on the logical state of the data bit, the pre-charged RBL 503 may start to be discharged. In some embodiments a sensing amplifier, coupled to the RBL 503 and a reference voltage, can use a polarity of a voltage difference between the RBL 503 and the reference voltage to determine whether the logical state of the data bit is a logical 1 or a logical 0. To write the logical state of the data bit stored in the memory cell 500, the same operations are performed that are performed in the memory cell 100 of FIG. 1.

Figure 6:
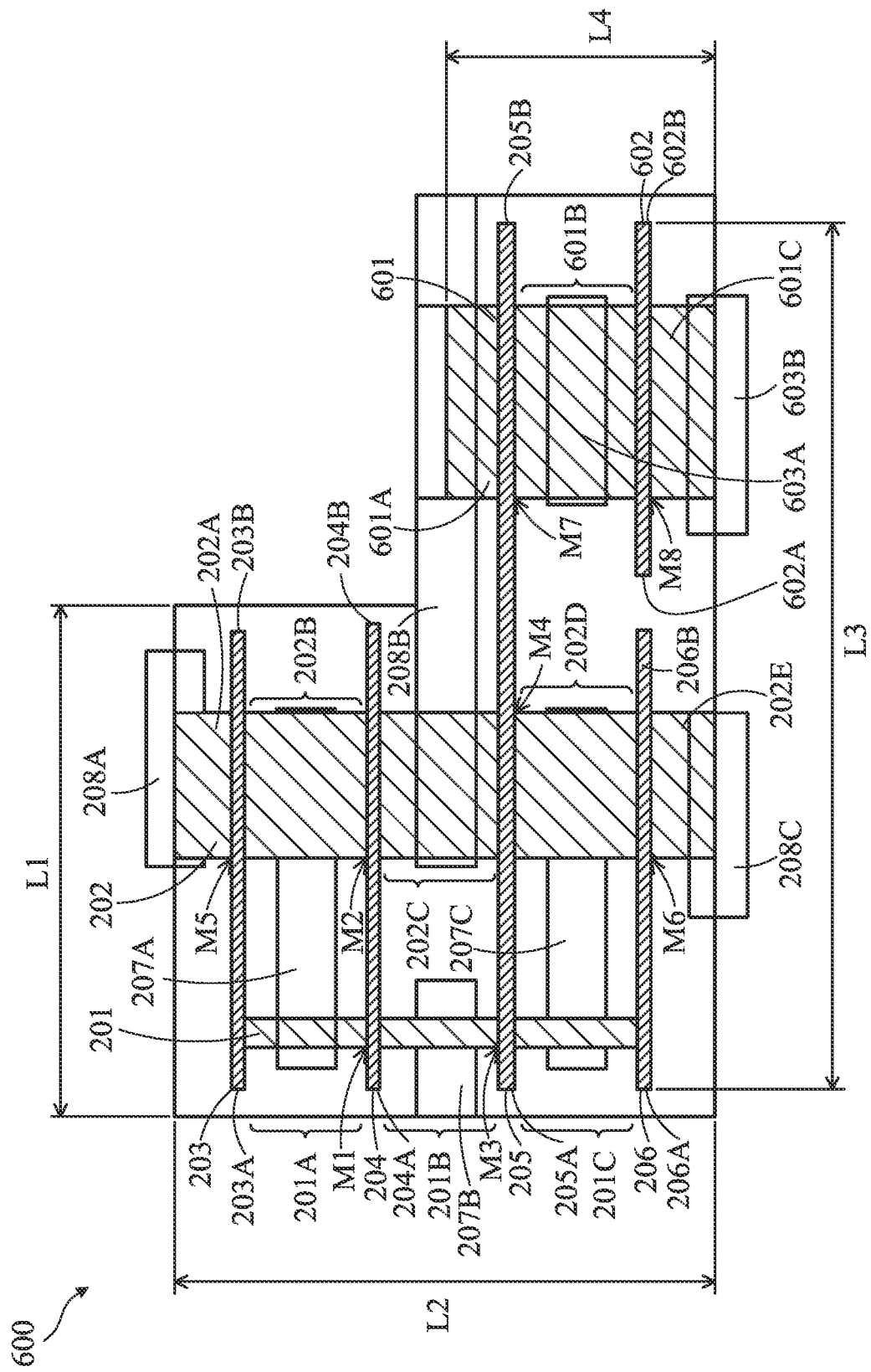
FIG. 6 is an example circuit layout, in accordance with some embodiments.
Figure 7:
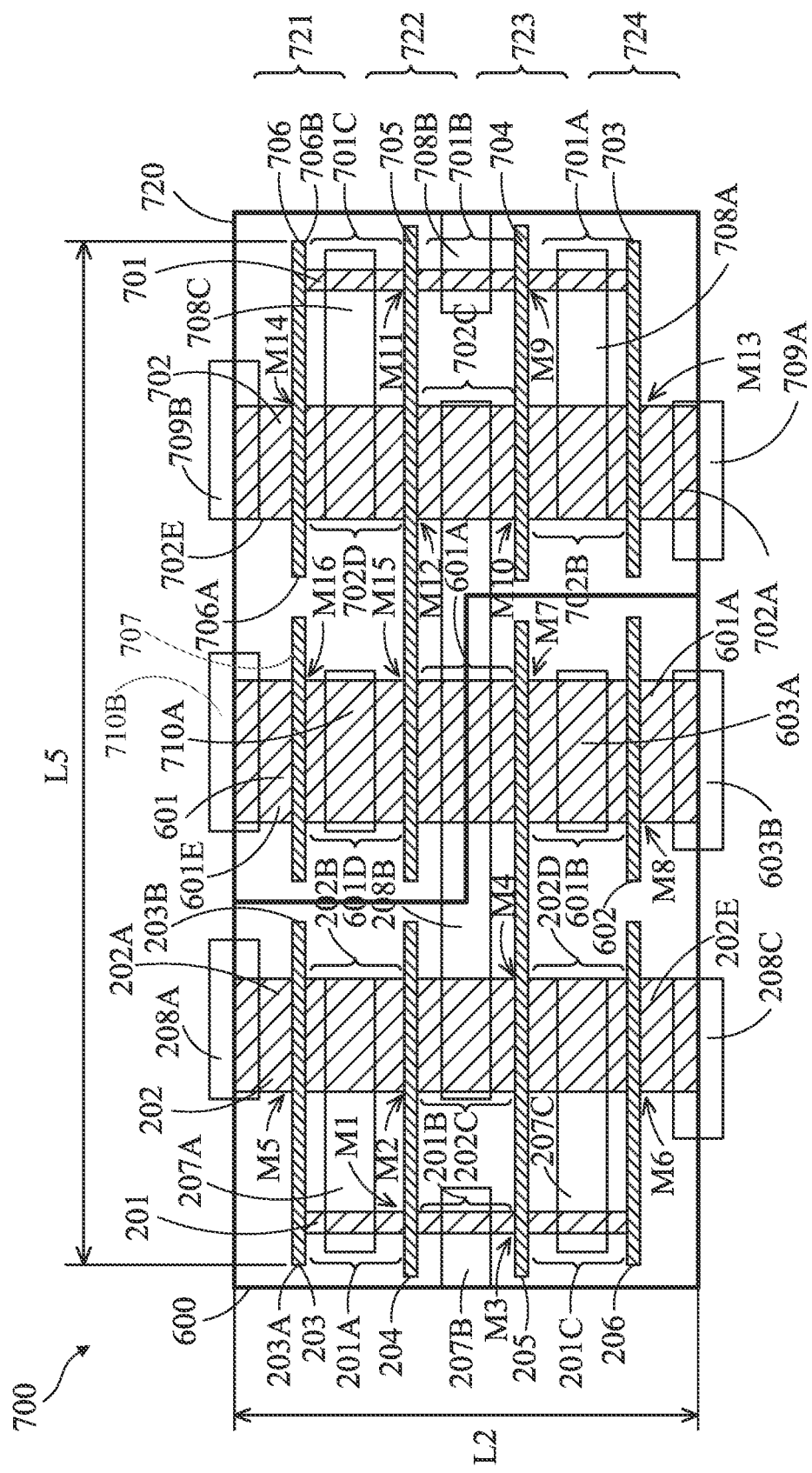
FIG. 7 is an example circuit layout, in accordance with some embodiments.
Figure 8:
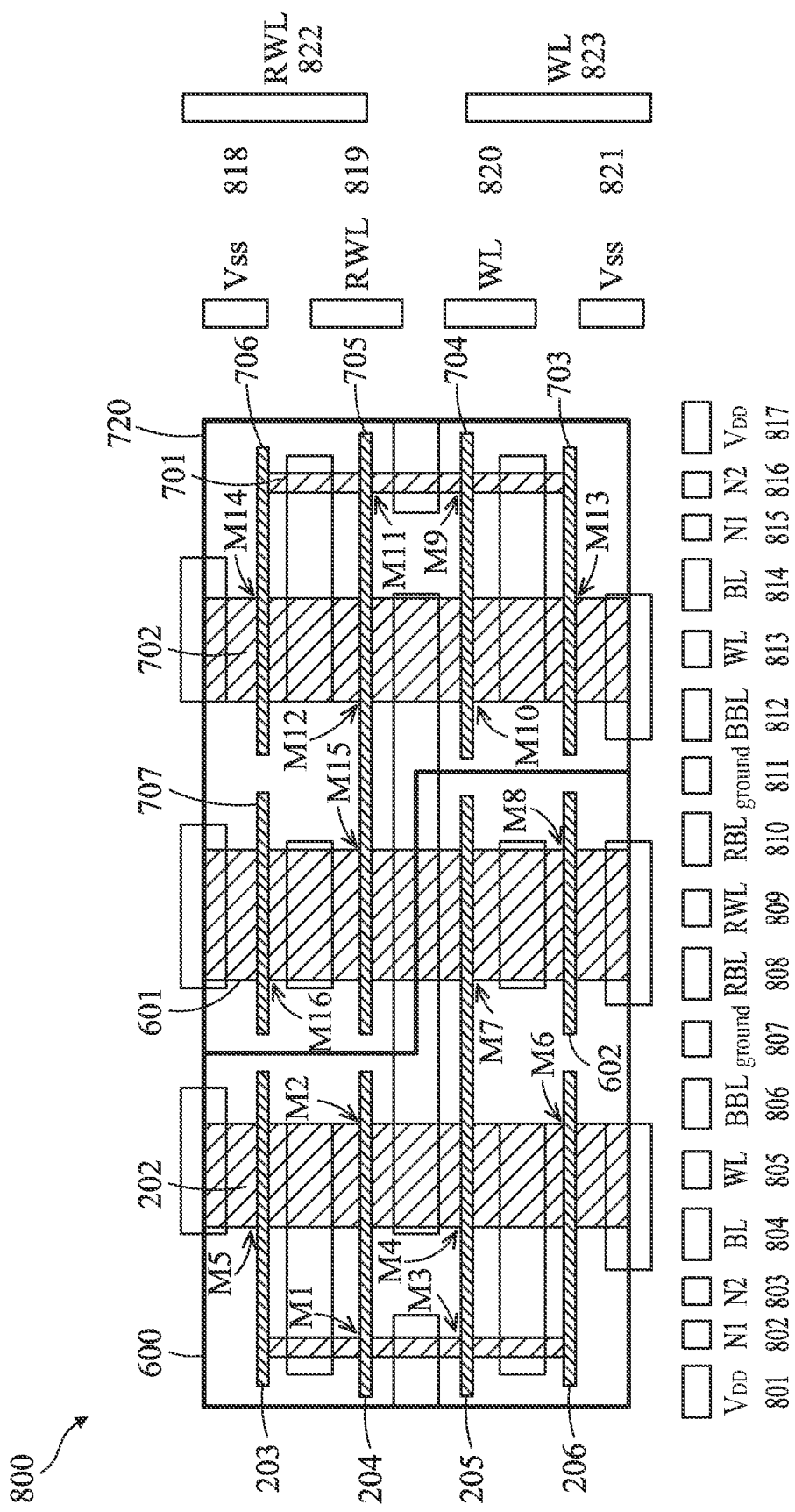
FIG. 8 is an example circuit layout, in accordance with some embodiments.

FIGS. 6, 7, and 8 illustrate various examples of circuit layouts to make the memory cell 500 in such a configuration. The components of the layouts shown in FIGS. 6-8 are the same or are similar to those depicted in FIG. 5 with the same reference number, and the detailed description thereof is omitted. It is appreciated that for clarity purposes, each of the layouts in FIGS. 6-8 has been simplified. Thus, some of the components (e.g., WBL 107, WBBL109, WWL 105) shown in FIG. 1 are omitted in the layouts of FIGS. 6-8.

Referring to FIG. 6, an example circuit layout 600 is depicted, in accordance with various embodiments. The circuit layout 600 is similar to the circuit layout 200 of FIG. 2 except that the circuit layout 600 includes feature 601 extending along a first direction (e.g., the Y direction) and feature 602 extending along a second direction (e.g., the X direction) perpendicular to the first direction. Additionally, feature 205 is extended further in the second direction than in circuit layout 200 of FIG. 2.

The feature 601 may be used to define or otherwise make an active region on a substrate. The feature 601 may be herein referred to as "active feature 601." The feature 602 may be used to define or otherwise make a gate of a transistor. Accordingly, the feature 602 may be herein referred to as "gate feature 602."

The gate features 203, 204, 205, 206, and 602 are arranged in four rows. For example, the gate feature 203 is in the first row, the gate feature 204 is in the second row, the gate feature 205 is in the third row, and the gate features 206 and 602 are in the fourth row. The first four gates 203-206 are similar to the first four gates 203-206 of the circuit layout 200 of FIG. 2 except that the gate feature 205 extends further to overlap the third active feature 601. The gate feature 602 is separated from the gate feature 206 in the second direction and is aligned with the gate feature 206 in the first direction. The gate feature 602 includes a first end 602A and a second end 602B.

In some embodiments, the first end 203A is aligned, in the second direction, with the first ends 204A-206A. In some embodiments, the second end 205B is aligned, in the second direction, with the second end 602B. In some embodiments, the second end 203B is aligned, in the second direction, with the second ends 204B and 206B. The length of each of the gate features 203, 204, and 206 in the second direction (that is, from the respective first end to the respective second end) is L1. The length of the gate feature 205 in the second direction (that is, from its first end 205A to its second end 205B) is L3. The length of the active feature 202 in the first direction is L2. The length of the active feature 601 in the first direction is L4. In some embodiments, L2 is greater than L1. In some embodiments, L3 is greater than L1. In some embodiments, L2 is greater than L4. In some embodiments, the memory cell 600 is L-shaped.

Each of the gate features 205 and 602 can extend across the active feature 601 to define a respective at least one of the transistors M7-M8. For example, the gate feature 205 is used to define a gate region of the pull-down transistor M7, sections 601A and 601B of the active feature 601 are used to define respective source region and drain region of the pull-down transistor M7, and a portion of the active feature 601 overlapped by the gate feature 205 is used to define nanostructures (e.g., a conduction channel) of the pull-down transistor M7. The gate feature 602 is used to define a gate region of the access transistor M8, sections 601B and 601C of the active feature 601 are used to define respective drain region and source region of the access transistor M8, and a portion of the active feature 601 overlapped by the gate feature 602 is used to define nanostructures (e.g., a conduction channel) of the access transistor M8.

Additionally, the layout 600 includes a number of features 603A and 603B extending along the second direction, and feature 208B extends further in the second direction than in the circuit layout 200 of FIG. 2. Each of the 603A and 603B may overlay the corresponding section of an active feature. The features 603A and 603B may be herein referred to as "contact features 603A and 603B," respectively, or "MD features 603A and 603B," respectively. In some embodiments, an MD structure in accordance with the contact feature can be formed as a via extending into the source/drain region of a respective one of the transistors M7 and M8.

The contact features 208B and 603A may be used to form metal structures extending into the source region and drain region of the pull-down transistor M7, respectively. The contact features 603A and 603B may be used to form metal structures extending into the drain region and source region of the access transistor M8, respectively.

Referring to FIG. 7, an example circuit layout 700 is depicted, in accordance with various embodiments, including circuit layouts 600 and 720. The circuit layout 600 is similar to that of FIG. 6 except that active feature 601 extends, in the first direction, into the circuit layout 720, and contact feature 208B extends, in the second direction, into the circuit layout 720. As shown, the circuit layout 720 includes a number of features 701, 702, and 601 extending along a first direction (e.g., the Y direction), and a number of features 703, 704, 705, 706, and 707 extending along a second direction (e.g., the X direction) perpendicular to the first direction.

The features 701, 702, and 601 may be used to define or otherwise make an active region on a substrate. Accordingly, the features 701, 702, and 601 may be herein referred to as "active features 701, 702, and 601," respectively.

The features 703-707 may be used to define or otherwise make gates of, or shared by, one or more of the transistors. Accordingly, the features 703-707 may be herein referred to as "gate features 703, 704, 705, 706, and 707," respectively.

Each of the gate features 703-707 can extend across at least one of the active features 701, 702, and 601 to define a respective at least one of the transistors M9-M18. For example, the gate feature 703 is used to define a gate region of the access transistor M13, sections 702A and 702B of the active feature 702 are used to define respective source region and drain region of the access transistor M13, and a portion of the active feature 702 overlapped by the gate feature 703 is used to define nanostructures (e.g., a conduction channel) of the access transistor M13. The gate feature 704 is used to define a gate region of the pull-down transistor M10, sections 702B and 702C of the active feature 702 are used to define respective drain region and source region of the pull-down transistor M10, and a portion of the active feature 702 overlapped by the gate feature 704 is used to define nanostructures (e.g., a conduction channel) of the pull-down transistor M10. The gate feature 704 is also used to define a gate region of the pull-up transistor M9, sections 701A and 701B of the active feature 701 are used to define respective drain region and source region of the pull-up transistor M9, and a portion of the active feature 701 overlapped by the gate feature 704 is used to define nanostructures (e.g., a conduction channel) of the pull-up transistor M9. The gate feature 705 is used to define a gate region of the pull-up transistor M11, sections 701B and 701C of the active feature 701 are used to define respective source region and drain region of the pull-up transistor M11, and a portion of the active feature 701 overlapped by the gate feature 705 is used to define nanostructures (e.g., a conduction channel) of the pull-up transistor M11. The gate feature 705 is also used to define a gate region of the pull-down transistor M12, sections 702C and 702D of the active feature 702 are used to define respective source region and drain region of the pull-down transistor M12, and a portion of the active feature 702 overlapped by the gate feature 705 is used to define nanostructures (e.g., a conduction channel) of the pull-down transistor M12. The gate feature 706 is used to define a gate region of the access transistor M14, sections 702D and 702E of the active feature 702 are used to define respective drain region and source region of the access transistor M14, and a portion of the active feature 702 overlapped by the gate feature 706 is used to define nanostructures (e.g., a conduction channel) of the access transistor M14.

The gate features 203-206, 602, and 703-707 are arranged in four rows 721-724. For example, the gate features 203, 706, and 707 are in the first row 721, the gate features 204 and 705 are in the second row 722, the gate features 205 and 704 are in the third row 723, and the gate features 206, 602, and 703 are in the fourth row 724. The gate feature 704 is separated from the gate feature 703 in the first direction. The gate feature 705 is separated from the gate features 703-704 in the first direction and is closer to the gate feature 704 than to the gate feature 703. The gate feature 706 is separated from the gate features 703-705 in the first direction and is closer to the gate feature 705 than to the gate feature 703 or the gate feature 704. The gate feature 707 is separated from the gate feature 706 in the second direction and is aligned with the gate feature 706 in the first direction.

The length of each row of the gate features in the second direction is L5. For example, the length from a first end 203A of the gate feature 203 to a second end 706B of the gate feature 706 is L5. The length of at least one of the active features 202, 601, and 702 in the first direction is L2. In some embodiments, the circuit layout 700 is rectangular-shaped.

The gate feature 705 is also used to define a gate region of the pull-down transistor M15, sections 601A and 601D of the active feature 601 are used to define respective source region and drain region of the pull-down transistor M15, and a portion of the active feature 601 overlapped by the gate feature 705 is used to define nanostructures (e.g., a conduction channel) of the pull-down transistor M15. The gate feature 707 is used to define a gate region of the access transistor M16, sections 601D and 601E of the active feature 601 are used to define respective drain region and source region of the access transistor M16, and a portion of the active feature 601 overlapped by the gate feature 707 is used to define nanostructures (e.g., a conduction channel) of the access transistor M16.

Additionally, the layout 720 includes a number of features 708A, 708B, 708C, 709A, 709B, 710A, 710B, and 208B extending along the second direction. Each of the 708A, 708B, 708C, 709A, 709B, 710A, 710B, and 208B may overlay the corresponding section of an active feature. In some embodiments, each of the features 708A-C, 709A-B, 710A-B, and 208B may be used to define or otherwise make the (e.g., metal-defined) contact/structure for a respective one of the transistors M9-M16. Accordingly, the features 708A-C, 709A-B, 710A-B, and 208B may be herein referred to as "contact features 708A-C, 709A-B, 710A-B, and 208B," respectively, or "MD features 708A-C, 709A-B, 710A-B, and 208B," respectively. In some embodiments, an MD structure according to the contact feature can be formed as a via extending into the source/drain region of a respective one of the transistors M9-M16.

The contact features 709A and 708A may be used to form metal structures extending into the source region and drain region of the access transistor M13, respectively. The contact features 708A and 208B may be used to form metal structures extending into the drain region and source region of the pull-down transistor M10, respectively. The contact features 708A and 708B may be used to form metal structures extending into the drain region and source region of the pull-up transistor M9, respectively. The contact features 708B and 708C may be used to form metal structures extending into the source region and drain region of the pull-up transistor M11, respectively.

The contact features 208B and 708C may be used to form metal structures extending into the source region and drain region of the pull-down transistor M12, respectively. The contact features 708C and 709B may be used to form metal structures extending into the drain region and source region of the access transistor M14, respectively. The contact features 208B and 710A may be used to form metal structures extending into the source region and drain region of the pull-down transistor M15, respectively. The contact features 710A and 710B may be used to form metal structures extending into the drain region and source region of the access transistor M16, respectively.

Referring to FIG. 8, an example circuit layout 800 is depicted, in accordance with various embodiments. The circuit layout 800 is similar to the circuit layout 700 of FIG. 7 except that the circuit layout 800 includes metal 0 (M0) features, metal 1 (M1) features, and metal 3 (M3) features. M0 features may extend in the first direction. M0 features may extend to at least one of the gate features or the MD features of the circuit layout 800. A VG feature may extend into a gate feature and the corresponding M0 feature that is extending to the gate feature. A VD feature may extend into an MD feature and the corresponding M0 feature that is extending to the MD feature. M0 features include VDD 801, N1 802, N2 803, BL 804, WL 805, BBL 806, ground 807, RBL 808, RWL 809, RBL 810, ground 811, BBL 812, WL 813, BL 814, N1 815, N2 816, and VDD 817. N1 802 and N1 815 may be instances of node 110. N2 803 and N2 816 may be instances of node 114.

M1 and M3 features may extend in the second direction. M1 and M3 features may extend to an M0 feature. A V0 feature may extend into an M0 feature and the corresponding M1 feature that is extending to the M0 feature. A series of an V0 feature, M1 feature, V1 feature, M2 feature, and V2 feature may extend into an M0 feature and the corresponding M3 feature that is extending to the M0 feature. The M1 features may include ground 818, RWL 819, WL 820, and ground 821. The M3 features may include RWL 822 and WL 823. In some embodiments, both of WL 820 and WL 823 may be extended over a M0 feature corresponding to at least one of the access (e.g., WL) transistors M5, M6, M13, or M14. The WL 820 and WL 823 may be used to define two metal structures (in M1 and M3, respectively) for routing the gate of at least one of the access transistors M5, M6, M13, or M14, having a lower resistance than a resistance of only one metal structure for routing to the gate of the at least one of the access transistors M5, M6, M13, or M14. In some embodiments, both of RWL 819 and RWL 822 may similarly extend over a M0 feature corresponding to at least one of the access (RWL) transistors M8 or M16.

Figure 9:
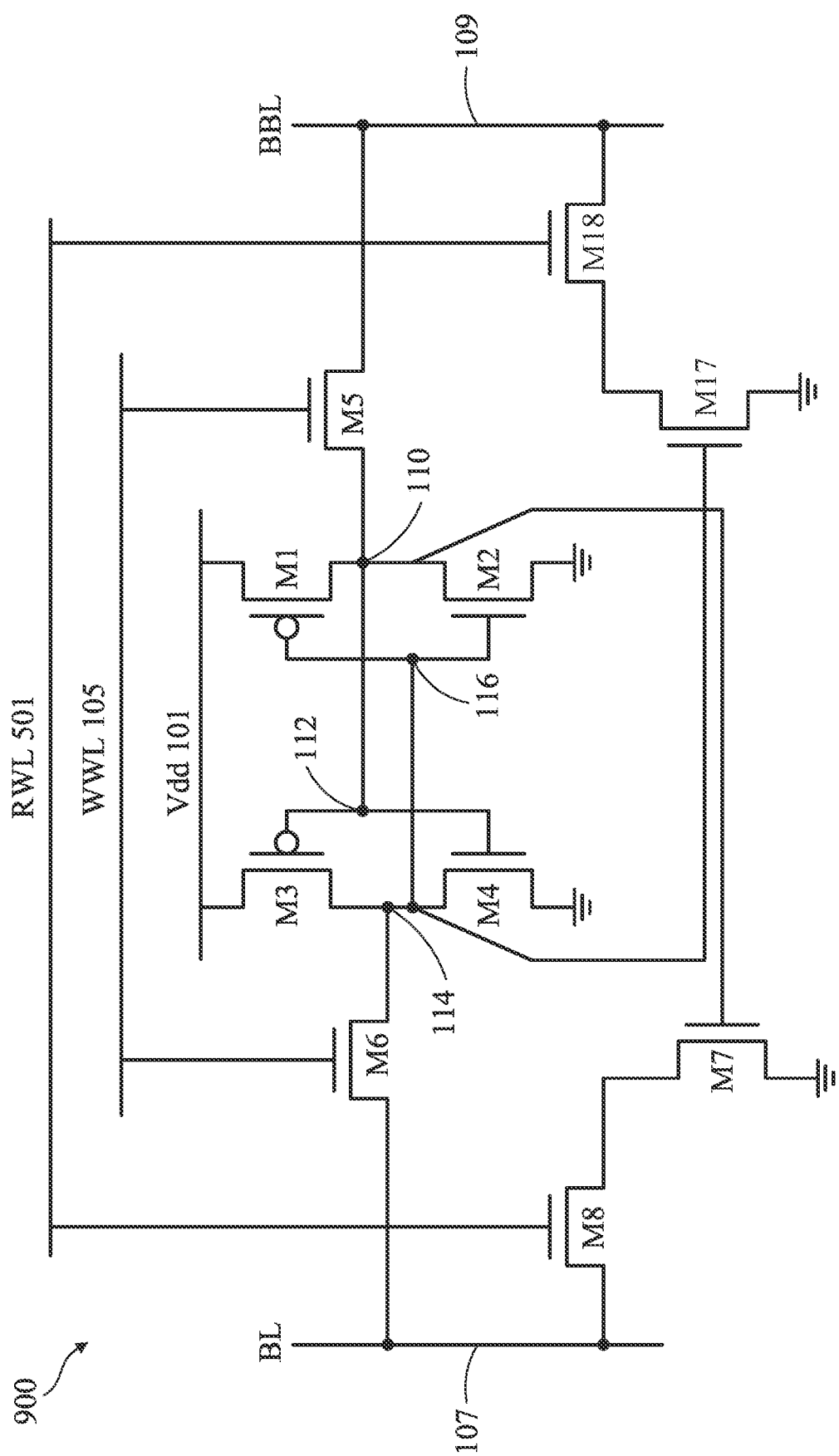
FIG. 9 is an example circuit diagram, in accordance with some embodiments.

Referring to FIG. 9, an example circuit diagram of a memory cell 900 is illustrated. The memory cell 900 is similar to the memory cell 500 of FIG. 5 except that the memory cell 900 includes two additional transistors (pull-down transistor M17 and access transistor M18), such that the memory cell 900 is that of a ten-transistor (IOT)-SRAM cell. Additionally, the WBL 107 and the RBL 503 of FIG. 5 are merged into the BL 107.

A gate of the pull-down transistor M17 is coupled to the output of the inverter formed by the transistors M3 and M4. One of the source or drain of the access transistor M18 is coupled to a drain of the pull-down transistor M17. A source of the pull-down transistor M17 is coupled to ground. In some embodiments, M17 can be implemented as a pull-up transistor. A gate of the access transistor M18 is coupled to a read word line (RWL) 501. A second one of the source or drain of the access transistor M18 is coupled to the BBL 109. The read operation for the memory cell 900 is similar to the read operation for the memory cell 500 of FIG. 5. The write operation for the memory cell 900 is similar to the write operation for the memory cells 100 and 500, of FIGS. 1 and 5, respectively.

Figure 10:
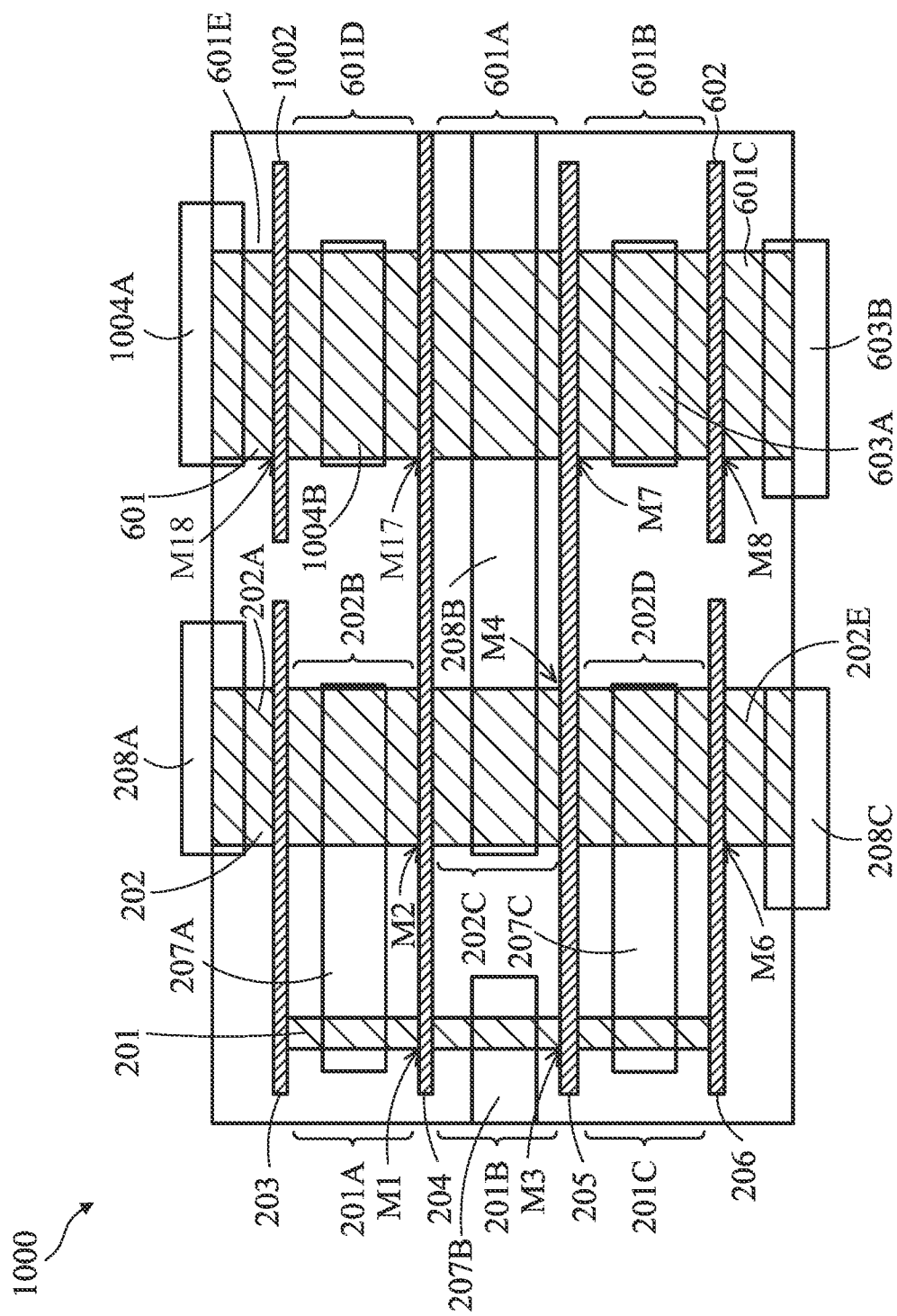
FIG. 10 is an example circuit layout, in accordance with some embodiments.

Referring to FIG. 10, an example circuit layout 1000 is depicted, in accordance with various embodiments. FIG. 10 illustrates an example of a circuit layout to make the memory cell 900 in such a configuration. The circuit layout 1000 is similar to the circuit layout 600 of FIG. 6 except that the circuit layout 1000 includes feature 1002 extending along a second direction (e.g., the X direction) perpendicular to the first direction (e.g., the Y direction). Additionally, the feature 601 is extended further in the first direction than in circuit layout 600 of FIG. 6, and the feature 204 is extended further in the second direction than in circuit layout 600 of FIG. 6.

The feature 1002 may be used to define or otherwise make a gate of a transistor. Accordingly, the feature 1002 may be herein referred to as "gate feature 1002."

Each of the gate features 204 and 1002 can extend across the active feature 601 to define a respective at least one of the transistors M17-M18. For example, the gate feature 204 is used to define a gate region of the pull-down transistor M17, sections 601A and 601D of the active feature 601 are used to define respective source region and drain region of the pull-down transistor M17, and a portion of the active feature 601 overlapped by the gate feature 204 is used to define nanostructures (e.g., a conduction channel) of the pull-down transistor M17. The gate feature 1002 is used to define a gate region of the access transistor M18, sections 601D and 601E of the active feature 601 are used to define respective drain region and source region of the access transistor M18, and a portion of the active feature 601 overlapped by the gate feature 1002 is used to define nanostructures (e.g., a conduction channel) of the access transistor M18.

Additionally, the layout 1000 includes a number of features 1004A and 1004B extending along the second direction. Each of the 1004A and 1004B may overlay the corresponding section of an active feature. The features 1004A and 1004B may be herein referred to as "contact features 1004A and 1004B," respectively, or "MD features 1004A and 1004B," respectively. In some embodiments, an MD structure in accordance with the contact feature can be formed as a via extending into the source/drain region of a respective one of the transistors M17 and M18.

The contact features 208B and 1004B may be used to form metal structures extending into the source region and drain region of the pull-down transistor M17, respectively. The contact features 1004B and 1004A may be used to form metal structures extending into the drain region and source region of the access transistor M18, respectively.

Figure 11:
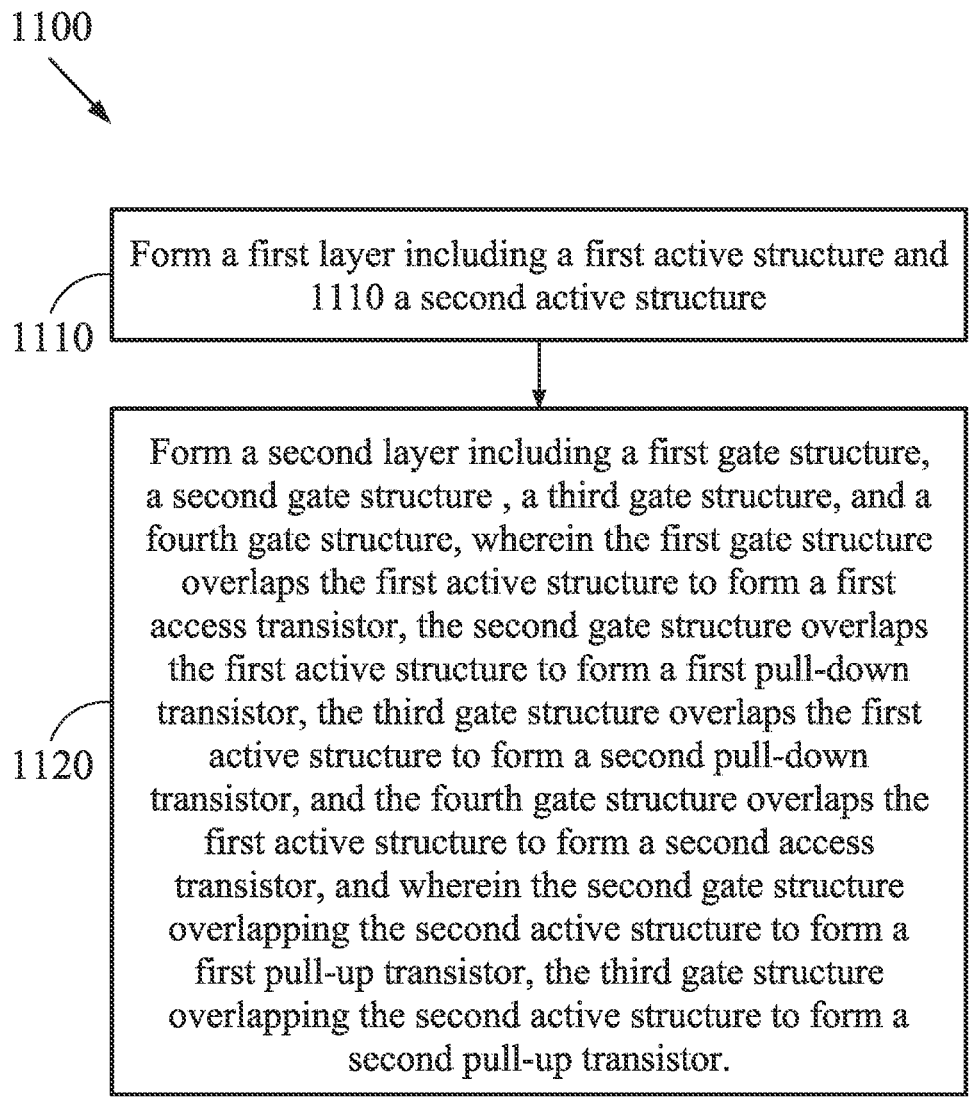
FIG. 11 is a flowchart of a method of forming a memory cell, in accordance with some embodiments.

FIG. 11 is a flowchart of a method 1100 of forming a memory cell, in accordance with some embodiments. In some embodiments, the memory device may be formed in accordance with at least one of the memory cells 100, 500, and 900 with respect to FIGS. 1, 5, and 9 or one of the circuit layouts 200-300, 600-800, or 1000 with respect to the FIGS. 2-3, 6-8, and 10. In some embodiments, some or all of method 1100 is executed by a processor of a computer. In some embodiments, some or all of method 1100 is executed by a processor 1202 of an IC layout diagram generation system 1200, discussed below with respect to FIG. 12. Some or all of the operations of method 1100 are capable of being performed as part of a design procedure performed in a design house, e.g., a design house 3020 discussed below with respect to FIG. 13.

In some embodiments, the operations of method 1100 are performed in the order depicted in FIG. 11. In some embodiments, the operations of method 1100 are performed simultaneously and/or in an order other than the order depicted in FIG. 11. In some embodiments, one or more operations are performed before, between, during, and/or after performing one or more operations of method 1100.

At operation 1110, the processor forms a first layer including a first active structure extending in a first direction (e.g., Y direction) and a second active structure extending in the first direction and separated from the first active structure in a second direction (e.g., X direction) perpendicular to the first direction. At operation 1120, the processor forms a second layer including a first gate structure extending in the second direction, a second gate structure extending in the second direction and separated from the first gate structure in the first direction, a third gate structure extending in the second direction, separated from the first and second gate structures in the first direction, and closer to the second gate structure than to the first gate structure, and a fourth gate structure extending in the second direction, separated from the first, second, and third gate structures in the first direction, and closer to the third gate structure than to the first or second gate structure. The first gate structure overlaps the first active structure to form a first access transistor, the second gate structure overlaps the first active structure to form a first pull-down transistor, the third gate structure overlaps the first active structure to form a second pull-down transistor, and the fourth gate structure overlaps the first active structure to form a second access transistor. The second gate structure overlaps the second active structure to form a first pull-up transistor, and the third gate structure overlaps the second active structure to form a second pull-up transistor.

In some embodiments, the first layer further comprises a third active structure extending in the first direction, separated from the first and second active structures in the second direction, and closer to the first active structure than to the second active structure. In some embodiments, the second layer includes a fifth gate structure extending in the second direction, aligned with the fourth gate structure in the first direction, and separated from the fourth gate structure in the second direction. In some embodiments, the third gate structure overlaps the third active structure to form a third pull-down transistor and the fifth gate structure overlaps the third active structure to form a third access transistor.

Figure 12:
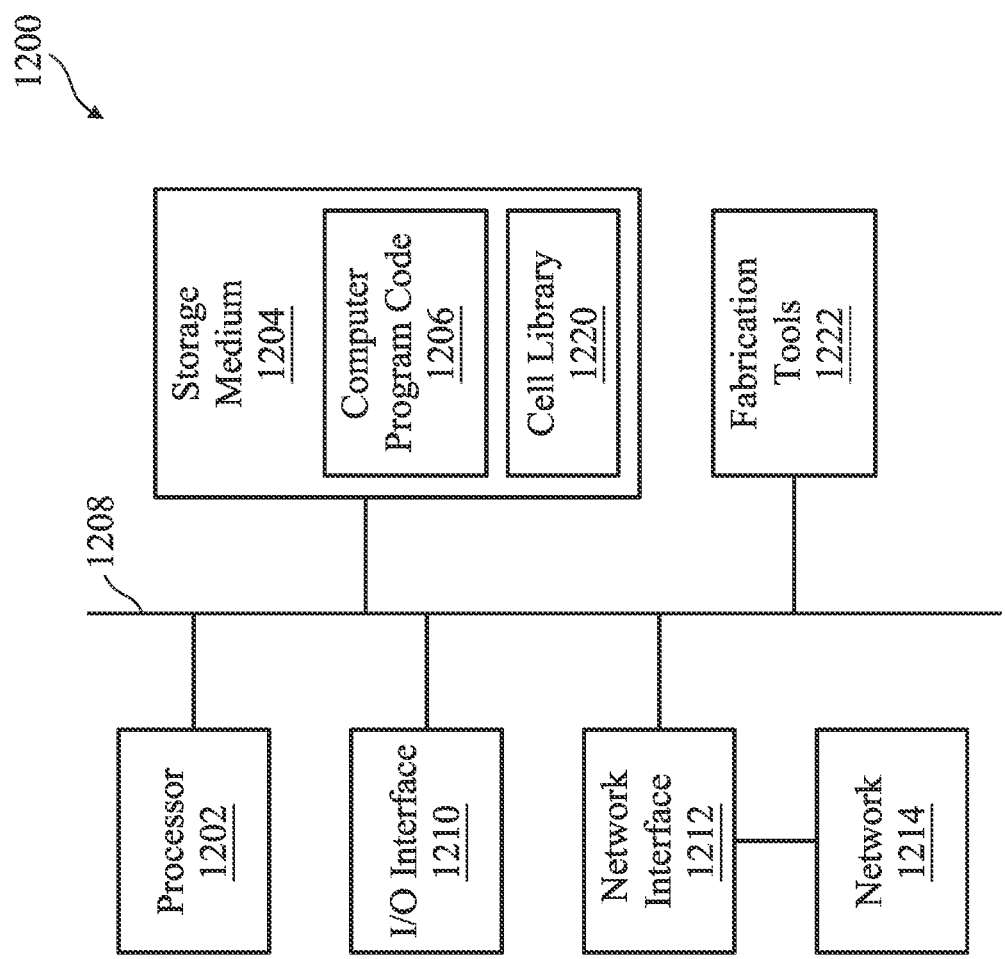
FIG. 12 is a block diagram of IC layout diagram generation system, in accordance with some embodiments.

FIG. 12 is a block diagram of IC layout diagram generation system 1200, in accordance with some embodiments. In some embodiments, IC layout diagram generation system 1200 includes an electronic design automation (EDA). In some embodiments, IC layout diagram generation system 1200 includes or is part of an automatic place and route (APR) system. Methods described herein of designing IC layout diagrams representing fin arrangements, in accordance with one or more embodiments, are implementable, for example, IC layout diagram generation system 1200, in accordance with some embodiments.

In some embodiments, IC layout diagram generation system 1200 is a general purpose computing device including processor 1202 and a non-transitory, computer-readable storage medium 1204. Computer-readable storage medium 1204, amongst other things, is encoded with, i.e., stores, computer program code 1206, i.e., a set of executable instructions. Execution of instructions 1206 by processor 1202 represents (at least in part) an IC layout diagram generation tool which can be used to generate or implement circuit layouts 200-300, 600-800, and 1000 discussed above with respect to FIGS. 2-3, 6-8, and 10 (hereinafter, the noted processes and/or methods).

Processor 1202 is electrically coupled to computer-readable storage medium 1204 via a bus 1208. Processor 1202 is also electrically coupled to an I/O interface 1210 by bus 1208. A network interface 1212 is also electrically connected to processor 1202 via bus 1208. Network interface 1212 is connected to a network 1214, so that processor 1202 and computer-readable storage medium 1204 are capable of connecting to external elements via network 1214. Processor 1202 is configured to execute computer program code 1206 encoded in computer-readable storage medium 1204 in order to cause IC layout diagram generation system 1200 to be usable for performing a portion or all of the noted processes and/or methods. In one or more embodiments, processor 1202 is a central processing unit (CPU), a multi-processor, a distributed processing system, an application specific integrated circuit (ASIC), and/or a suitable processing unit.

In one or more embodiments, computer-readable storage medium 1204 is an electronic, magnetic, optical, electromagnetic, infrared, and/or a semiconductor system (or apparatus or device). For example, computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1204 includes a compact disk-read only memory (CD-ROM), a compact disk-read/write (CD-R/W), and/or a digital video disc (DVD).

In one or more embodiments, computer-readable storage medium 1204 stores computer program code 1206 configured to cause IC layout diagram generation system 1200 (where such execution represents (at least in part) the IC layout diagram generation tool) to be usable for performing a portion or all of the noted processes and/or methods. In one or more embodiments, computer-readable storage medium 1204 also stores information which facilitates performing a portion or all of the noted processes and/or methods. In one or more embodiments, computer-readable storage medium 1204 stores library 1220 of standard cells including IC layout diagrams as disclosed herein, e.g., one or more of the circuit layouts 200-300, 600-800, and 1000 discussed above with respect to FIGS. 2-3, 6-8, and 10.

IC layout diagram generation system 1200 includes I/O interface 1210. I/O interface 1210 is coupled to external circuitry. In one or more embodiments, I/O interface 1210 includes a keyboard, keypad, mouse, trackball, trackpad, touchscreen, and/or cursor direction keys for communicating information and commands to processor 1202.

IC layout diagram generation system 1200 also includes network interface 1212 coupled to processor 1202. Network interface 1212 allows IC layout diagram generation system 1200 to communicate with network 1214, to which one or more other computer systems are connected. Network interface 1212 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC layout diagram generation systems 1200.

IC layout diagram generation system 1200 is configured to receive information through I/O interface 1210. The information received through I/O interface 1210 includes one or more of instructions, data, design rules, libraries of standard cells, and/or other parameters for processing by processor 1202. The information is transferred to processor 1202 via bus 1208. IC layout diagram generation system 1200 is configured to receive information related to a user interface (UI) through I/O interface 1210.

In some embodiments, the system 1200 may also be associated with various fabrication tools 1222. Among other things, the fabrication tools 1222 may be used to prepare and fabricate a set of masks based on the standard cell layout created by a standard cell layout application. The set of masks may define the geometry for the photolithography steps used during semiconductor fabrication of the circuit.

To prepare a set of masks, the fabrication tools 1222 may be used to translate the standard cell layout of the circuit into a representative data file ("RDF"). The RDF may then be used to fabricate a set of physical masks to fabricate the circuit.

In some embodiments, preparing the set of masks may include performing an optical proximity correction (OPC) using lithography enhancement techniques to compensate for image errors, such as those that can arise from diffraction, interference, other process effects and the like, in the standard cell layout. In some embodiments, a mask rule checker (MRC) of the fabrication tools 1222 may check the standard cell layout that has undergone processes in OPC with a set of mask creation rules. The mask creation rules may contain certain geometric and/or connectivity restrictions to ensure sufficient margins, to account for variability in semiconductor manufacturing processes, and the like. In some embodiments, the MRC may modify the standard cell layout to compensate for limitations during the fabrication of the set of masks. In some embodiments, preparing the set of masks may also include resolution enhancement techniques (RET), such as off-axis illumination, sub-resolution assist features, phase-shifting masks, other suitable techniques, and the like or combinations thereof.

The preparation of the set of masks may further include, in some embodiments, lithography process checking (LPC) that may simulate processes implemented to fabricate the circuit. LPC may simulate these processes based on the standard cell layout to create a simulated manufactured device of the circuit. LPC may take into account various factors, such as aerial image contrast, depth of focus ("DOF"), mask error enhancement factor ("MEEF"), other suitable factors, and the like or combinations thereof, to simulate the fabrication of the circuit. In some embodiments, after a simulated manufactured device has been created by LPC, if the simulated device does not satisfy certain design rules, OPC and/or MRC may be repeated to further refine the standard cell layout.

To fabricate the set of masks, a mask writer may convert the RDF to an image on a substrate, such as a mask (reticle) or a semiconductor wafer. In some embodiments, an electron-beam (e-beam) or a mechanism of multiple e-beams may be used to form a mask pattern on a semiconductor wafer to form the mask. In some embodiments, the mask pattern may include one or more opaque regions and one or more transparent regions. A radiation beam, such as an ultraviolet (UV) beam, used to expose the image sensitive material layer (e.g., photoresist) which has been coated on the semiconductor wafer, may be blocked by the opaque regions and transmits through the transparent regions. In one example, the mask pattern may include a transparent substrate (e.g., fused quartz) and an opaque material (e.g., chromium) coated in the opaque regions to form the mask. In other embodiments, other or additional techniques may be used to fabricate the masks.

Once the masks are fabricated, a fabrication entity (e.g., a manufacturing facility or semiconductor foundry) may use the fabricated masks to fabricate the circuit. In some embodiments, fabricating the circuit may involve depositing one or material in/on a semiconductor wafer using the mask (or masks). The semiconductor wafer may include a silicon substrate or other substrate having material layers formed thereon. The semiconductor wafer may further include one or more of various doped regions, dielectric features, multilevel interconnects, and the like formed using one or more of the masks.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC layout diagram generation system 1200. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 13:
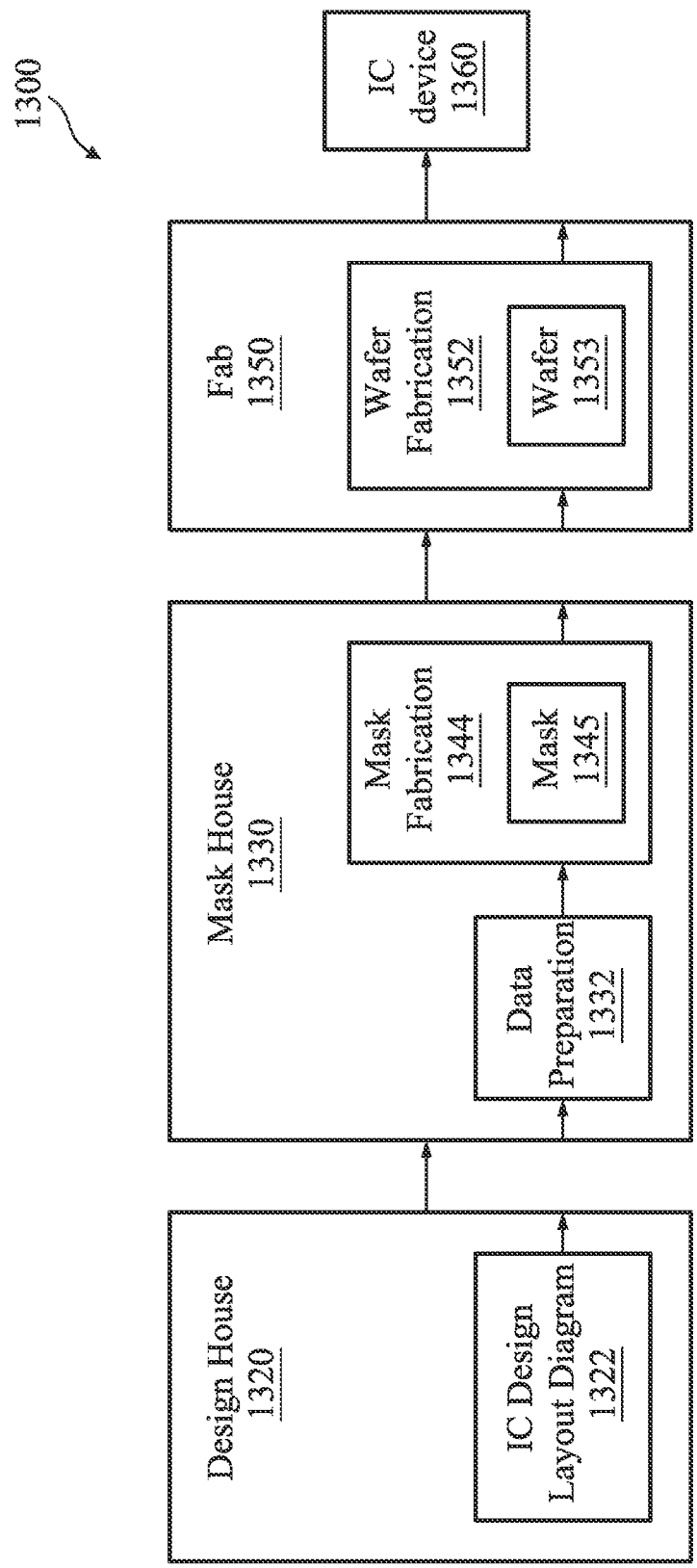
FIG. 13 is a block diagram of IC manufacturing system, and an IC manufacturing flow associated therewith, in accordance with some embodiments.

FIG. 13 is a block diagram of IC manufacturing system 1300, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1300.

In FIG. 13, IC manufacturing system 1300 includes entities, such as a design house 1320, a mask house 1330, and an IC manufacturer/fabricator ("fab") 1350, that interact with one another in the design, development, and manufacturing cycles and/or services related to manufacturing an IC device 1360. The entities in system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1320, mask house 1330, and IC fab 1350 is owned by a single larger company. In some embodiments, two or more of design house 1320, mask house 1330, and IC fab 1350 coexist in a common facility and use common resources.

Design house (or design team) 1320 generates an IC design layout diagram 1322. IC design layout diagram 1322 includes various geometrical patterns, e.g., one or more of the circuit layouts 200-300, 600-800, and 1000 discussed above with respect to FIGS. 2-3, 6-8, and 10, designed for an IC device 1360, e.g., an IC device including the IC structure 400 discussed above with respect to FIG. 4. The geometrical patterns correspond to patterns of metal, oxide, or semiconductor layers that make up the various components of IC device 1360 to be fabricated. The various layers combine to form various IC features. For example, a portion of IC design layout diagram 1322 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1320 implements a proper design procedure to form IC design layout diagram 1322. The design procedure includes one or more of logic design, physical design, or place and route. IC design layout diagram 1322 is presented in one or more data files having information of the geometrical patterns. For example, IC design layout diagram 1322 can be expressed in a GDSII file format or DFII file format.

Mask house 1330 includes data preparation 1332 and mask fabrication 1344. Mask house 1330 uses IC design layout diagram 1322 to manufacture one or more masks 1345 to be used for fabricating the various layers of IC device 1360 according to IC design layout diagram 1322. Mask house 1330 performs mask data preparation 1332, where IC design layout diagram 1322 is translated into a representative data file ("RDF"). Mask data preparation 1332 provides the RDF to mask fabrication 1344. Mask fabrication 1344 includes a mask writer. A mask writer converts the RDF to an image on a substrate, such as a mask (reticle) 1345 or a semiconductor wafer 1353. The design layout diagram 1322 is manipulated by mask data preparation 1332 to comply with particular characteristics of the mask writer and/or requirements of IC fab 1350. In FIG. 13, mask data preparation 1332 and mask fabrication 1344 are illustrated as separate elements. In some embodiments, mask data preparation 1332 and mask fabrication 1344 can be collectively referred to as mask data preparation.

In some embodiments, mask data preparation 1332 includes optical proximity correction (OPC) which uses lithography enhancement techniques to compensate for image errors, such as those that can arise from diffraction, interference, other process effects and the like. OPC adjusts IC design layout diagram 1322. In some embodiments, mask data preparation 1332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1332 includes a mask rule checker (MRC) that checks the IC design layout diagram 1322 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1322 to compensate for limitations during mask fabrication 1344, which may undo part of the modifications performed by OPC in order to meet mask creation rules.

In some embodiments, mask data preparation 1332 includes lithography process checking (LPC) that simulates processing that will be implemented by IC fab 1350 to fabricate IC device 1360. LPC simulates this processing based on IC design layout diagram 1322 to create a simulated manufactured device, such as IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1322.

It should be understood that the above description of mask data preparation 1332 has been simplified for the purposes of clarity. In some embodiments, data preparation 1332 includes additional features such as a logic operation (LOP) to modify the IC design layout diagram 1322 according to manufacturing rules. Additionally, the processes applied to IC design layout diagram 1322 during data preparation 1332 may be executed in a variety of different orders.

After mask data preparation 1332 and during mask fabrication 1344, a mask 1345 or a group of masks 1345 are fabricated based on the modified IC design layout diagram 1322. In some embodiments, mask fabrication 1344 includes performing one or more lithographic exposures based on IC design layout diagram 1322. In some embodiments, an electron-beam (e-beam) or a mechanism of multiple e-beams is used to form a pattern on a mask (photomask or reticle) 1345 based on the modified IC design layout diagram 1322. Mask 1345 can be formed in various technologies. In some embodiments, mask 1345 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1345 includes a transparent substrate (e.g., fused quartz) and an opaque material (e.g., chromium) coated in the opaque regions of the binary mask. In another example, mask 1345 is formed using a phase shift technology. In a phase shift mask (PSM) version of mask 1345, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1344 is used in a variety of processes. For example, such a mask(s) is used in an ion implantation process to form various doped regions in semiconductor wafer 1353, in an etching process to form various etching regions in semiconductor wafer 1353, and/or in other suitable processes.

IC fab 1350 includes wafer fabrication 1352. IC fab 1350 is an IC fabrication business that includes one or more manufacturing facilities for the fabrication of a variety of different IC products. In some embodiments, IC Fab 1350 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1350 uses mask(s) 1345 fabricated by mask house 1330 to fabricate IC device 1360. Thus, IC fab 1350 at least indirectly uses IC design layout diagram 1322 to fabricate IC device 1360. In some embodiments, semiconductor wafer 1353 is fabricated by IC fab 1350 using mask(s) 1345 to form IC device 1360. In some embodiments, the IC fabrication includes performing one or more lithographic exposures based at least indirectly on IC design layout diagram 1322. Semiconductor wafer 1353 includes a silicon substrate or other proper substrate having material layers formed thereon. Semiconductor wafer 1353 further includes one or more of various doped regions, dielectric features, multilevel interconnects, and the like (formed at subsequent manufacturing steps).

Details regarding an integrated circuit (IC) manufacturing system (e.g., system 1300 of FIG. 13), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

The present disclosure provides memory cells including four rows of gate structures. The memory cells include, but are not limited to 6T, 8T, and 10T memory cells. The four-row-memory cells allow a reduction in the WL loading via a smaller cell width and a stacking of metal routes. Moreover, the four-row design eliminates the need for ICP. As such, the above-identified technical issues can be resolved.

One aspect of this description relates to a memory cell. In some embodiments, the memory cell includes a first gate structure, a second gate structure, a third gate structure, a fourth gate structure, and a fifth gate structure that each extend along a first lateral direction, a first active structure extending along a second lateral direction and overlaid by respective first portions of the first to fourth gate structures, a second active structure extending along the second lateral direction and overlaid by respective second portions of the first to fourth gate structures, and a third active structure extending along the second lateral direction and overlaid by respective third portions of the third and fifth gate structures. In some embodiments, the first and second gate structures are aligned with each other, with the fourth and fifth gate structures aligned with a first segment and a second segment of the third gate structure, respectively. In some embodiments, the second lateral direction perpendicular to the first lateral direction.

In some embodiments, the first and second gate structures are aligned with each other in the first lateral direction. In some embodiments, the fourth and fifth gate structures are aligned with the first segment and the second segment of the third gate structure, respectively, in the first lateral direction. In some embodiments, the fourth gate structure is aligned with the first gate structure.

In some embodiments, a first end of the third gate structure is aligned with a second end of the fourth gate structure. In some embodiments, a third end of the third gate structure is aligned with a fourth end of the fifth gate structure. In some embodiments, the third gate structure is longer than the first gate structure in the first lateral direction. In some embodiments, the first active structure is longer than the third active structure in the second lateral direction.

In some embodiments, the first active structure is longer in the second lateral direction than the first gate structure is in the first lateral direction. In some embodiments, the third gate structure is disposed between the first gate structure and the fourth gate structure in the second lateral direction.

In some embodiments, the second active structure is disposed between the first active structure and the third active structure in the first lateral direction. In some embodiments, the respective portions of the first to fourth gate structures wrap around the first active structure.

In some embodiments, the memory cell includes a first metal-defined structure disposed between the first gate structure and the second gate structure, a second metal-defined structure disposed between the second gate structure and the third gate structure, and a third metal-defined structure disposed between the third gate structure and the fourth gate structure.

Another aspect of this description relates to a memory cell. In some embodiments, the memory cell includes a first n-type transistor, a second n-type transistor, a third n-type transistor, a fourth n-type transistor, a fifth n-type transistor, a sixth n-type transistor, a first p-type transistor, and a second p-type transistor. In some embodiments, the first and second p-type transistors are defined by a first active structure, the first to fourth n-type transistors are defined by a second active structure, and the fifth and sixth n-type transistors are defined by a third active structure. In some embodiments, the first active structure is spaced from the third active structure in a first lateral direction. In some embodiments, a first distance between the first n-type transistor and the fourth n-type transistor in a second lateral direction perpendicular to the first lateral direction is greater than a second distance between the fifth n-type transistor and the sixth n-type transistor in the second lateral direction.

In some embodiments, the second active structure is disposed between the first active structure and the third active structure. In some embodiments, the first active structure is longer than the third active structure. In some embodiments, the second n-type transistor and the second p-type transistor share a first gate structure. In some embodiments, the third n-type transistor, the fifth n-type transistor, and the third p-type transistor share a second gate structure.

In some embodiments, the fourth n-type transistor includes a third gate structure. In some embodiments, the second gate structure is disposed between the first gate structure and the third gate structure. In some embodiments, the second gate structure is longer than the first gate structure. In some embodiments, each of the n-type and p-type transistors include alternating layers of gate structure and active structure, wherein the alternating layers are disposed along a vertical direction.

Another aspect of this description relates to a method for forming a memory cell. In some embodiments, the method includes forming a first gate structure, a second gate structure, a third gate structure, a fourth gate structure, and a fifth gate structure that each extend along a first lateral direction, wherein the first and second gate structures are aligned with each other, with the fourth and fifth gate structures aligned with a first segment and a second segment of the third gate structure, respectively, forming a first active structure extending along a second lateral direction and overlaid by respective first portions of the first to fourth gate structures, the second lateral direction perpendicular to the first lateral direction, forming a second active structure extending also along the second lateral direction and overlaid by respective second portions of the first to fourth gate structures, and forming a third active structure extending along the second lateral direction and overlaid by respective third portions of the third and fifth gate structures.

In some embodiments, the method includes forming a first metal-defined structure between the first gate structure and the second gate structure, forming a second metal-defined structure between the second gate structure and the third gate structure, and forming a third metal-defined structure between the third gate structure and the fourth gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
   a first gate structure, a second gate structure, a third gate structure, a fourth gate structure, and a fifth gate structure that each extend along a first lateral direction, wherein the first and second gate structures are aligned with each other, with the fourth and fifth gate structures aligned with a first segment and a second segment of the third gate structure, respectively;
   a first active structure extending along a second lateral direction and overlaid by respective first portions of the first to fourth gate structures, the second lateral direction perpendicular to the first lateral direction;
   a second active structure extending along the second lateral direction and overlaid by respective second portions of the first to fourth gate structures; and
   a third active structure extending along the second lateral direction and overlaid by respective third portions of the third and fifth gate structures.

2. The memory cell of claim 1, wherein the first and second gate structures are aligned with each other in the first lateral direction, and wherein the fourth and fifth gate structures are aligned with the first segment and the second segment of the third gate structure, respectively, in the first lateral direction.

3. The memory cell of claim 1, wherein the fourth gate structure is aligned with the first gate structure.

4. The memory cell of claim 1, wherein a first end of the third gate structure is aligned with a second end of the fourth gate structure, and wherein a third end of the third gate structure is aligned with a fourth end of the fifth gate structure.

5. The memory cell of claim 1, wherein the third gate structure is longer than the first gate structure in the first lateral direction.

6. The memory cell of claim 1, wherein the first active structure is longer than the third active structure in the second lateral direction.

7. The memory cell of claim 1, wherein the first active structure is longer in the second lateral direction than the first gate structure is in the first lateral direction.

8. The memory cell of claim 1, wherein the third gate structure is disposed between the first gate structure and the fourth gate structure in the second lateral direction.

9. The memory cell of claim 1, wherein the second active structure is disposed between the first active structure and the third active structure in the first lateral direction.

10. The memory cell of claim 1, wherein the respective portions of the first to fourth gate structures wrap around the first active structure.

11. The memory cell of claim 1, further comprising:
    a first metal-defined structure disposed between the first gate structure and the second gate structure;
    a second metal-defined structure disposed between the second gate structure and the third gate structure; and
    a third metal-defined structure disposed between the third gate structure and the fourth gate structure.

12. A memory cell, comprising:
    a first n-type transistor, a second n-type transistor, a third n-type transistor, a fourth n-type transistor, a fifth n-type transistor, and a sixth n-type transistor;
    a first p-type transistor and a second p-type transistor;
    wherein the first and second p-type transistors are defined by a first active structure, the first to fourth n-type transistors are defined by a second active structure, and the fifth and sixth n-type transistors are defined by a third active structure, wherein the first active structure is spaced from the third active structure in a first lateral direction, wherein a first distance between the first n-type transistor and the fourth n-type transistor in a second lateral direction perpendicular to the first lateral direction is greater than a second distance between the fifth n-type transistor and the sixth n-type transistor in the second lateral direction.

13. The memory cell of claim 12, wherein the second active structure is disposed between the first active structure and the third active structure.

14. The memory cell of claim 12, wherein the first active structure is longer than the third active structure.

15. The memory cell of claim 12, wherein the second n-type transistor and the second p-type transistor share a first gate structure, and wherein the third n-type transistor, the fifth n-type transistor, and the third p-type transistor share a second gate structure.

16. The memory cell of claim 15, wherein the fourth n-type transistor includes a third gate structure, wherein the second gate structure is disposed between the first gate structure and the third gate structure.

17. The memory cell of claim 15, wherein the second gate structure is longer than the first gate structure.

18. The memory cell of claim 15, wherein each of the n-type and p-type transistors include alternating layers of gate structure and active structure, wherein the alternating layers are disposed along a vertical direction.

19. A method, comprising:
forming a first gate structure, a second gate structure, a third gate structure, a fourth gate structure, and a fifth gate structure that each extend along a first lateral direction, wherein the first and second gate structures are aligned with each other, with the fourth and fifth gate structures aligned with a first segment and a second segment of the third gate structure, respectively;
forming a first active structure extending along a second lateral direction and overlaid by respective first portions of the first to fourth gate structures, the second lateral direction perpendicular to the first lateral direction;
forming a second active structure extending along the second lateral direction and overlaid by respective second portions of the first to fourth gate structures; and
forming a third active structure extending along the second lateral direction and overlaid by respective third portions of the third and fifth gate structures.

20. The method of claim 19, further comprising:
forming a first metal-defined structure between the first gate structure and the second gate structure;
forming a second metal-defined structure between the second gate structure and the third gate structure; and
forming a third metal-defined structure between the third gate structure and the fourth gate structure.

* * * * *